(12) United States Patent
Oyer et al.

(10) Patent No.: US 11,164,905 B2
(45) Date of Patent: Nov. 2, 2021

(54) MANUFACTURE OF SEMICONDUCTOR DISPLAY DEVICE

(71) Applicant: Facebook Technologies, LLC, Menlo Park, CA (US)

(72) Inventors: Céline Claire Oyer, Cork (IE); Allan Pourchet, Cork (IE)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/595,948

(22) Filed: Oct. 8, 2019

(65) Prior Publication Data

US 2020/0127045 A1   Apr. 23, 2020

Related U.S. Application Data

(60) Provisional application No. 62/747,499, filed on Oct. 18, 2018.

(51) Int. Cl.
*H01L 27/15* (2006.01)
*H01L 33/62* (2010.01)
*H01L 21/683* (2006.01)

(52) U.S. Cl.
CPC ........ *H01L 27/153* (2013.01); *H01L 21/6838* (2013.01); *H01L 33/62* (2013.01); *H01L 2933/0033* (2013.01); *H01L 2933/0066* (2013.01)

(58) Field of Classification Search
CPC .. H01L 27/156; H01L 27/1218; H01L 33/486
See application file for complete search history.

(56) References Cited

U.S. PATENT DOCUMENTS

| 10,326,045 B2 | 6/2019 | Lo et al. |
| 2005/0059178 A1 | 3/2005 | Erchak et al. |
| 2005/0145864 A1 | 7/2005 | Sugiyama et al. |
| 2005/0264172 A1 | 12/2005 | Wojnarowski et al. |
| 2006/0057850 A1 | 3/2006 | Britt et al. |
| 2006/0113638 A1 | 6/2006 | Maaskant et al. |
| 2006/0186420 A1 | 8/2006 | Hirukawa et al. |
| 2011/0297914 A1 | 12/2011 | Zheng et al. |

(Continued)

OTHER PUBLICATIONS

U.S. Appl. No. 16/595,870, "Notice of Allowance", dated Feb. 9, 2021, 8 pages.

(Continued)

*Primary Examiner* — Kyoung Lee
*Assistant Examiner* — Christina A Sylvia
(74) *Attorney, Agent, or Firm* — Kilpatrick Townsend & Stockton LLP

(57) ABSTRACT

A method of manufacturing light emitting diode (LED) devices is provided. In one example, the method comprises: forming a plurality of LED dies on a starter substrate, each of the plurality of LED dies including a device-side bump; moving, using a pick up tool (PUT), the starter substrate and the plurality of LED dies towards a backplane, the backplane including a plurality of backplane-side bumps; establishing the conductive bonds between the device-side bumps of the plurality of LED dies and the backplane-side bumps of the backplane at the plurality of contact locations; and operating the PUT to release the starter substrate to enable transferring of the plurality of LED dies to the backplane.

23 Claims, 15 Drawing Sheets

(56) References Cited

U.S. PATENT DOCUMENTS

| | | |
|---|---|---|
| 2014/0166975 A1 | 6/2014 | Ito |
| 2014/0267683 A1* | 9/2014 | Bibl ................ G09G 3/006 |
| | | 348/87 |
| 2015/0155261 A1* | 6/2015 | Uhm ................ H01L 24/83 |
| | | 438/107 |
| 2015/0311415 A1 | 10/2015 | Song et al. |
| 2016/0315218 A1 | 10/2016 | Bour et al. |
| 2017/0069804 A1 | 3/2017 | Lin et al. |
| 2017/0142874 A1* | 5/2017 | Pourchet ............ H05K 13/0404 |
| 2017/0215280 A1 | 7/2017 | Chaji |
| 2017/0271557 A1 | 9/2017 | Brennan et al. |
| 2017/0338374 A1 | 11/2017 | Zou et al. |
| 2018/0006083 A1 | 1/2018 | Zhu et al. |
| 2018/0261582 A1* | 9/2018 | Henry ................ H01L 27/1214 |
| 2018/0277524 A1* | 9/2018 | Moon ................ H01L 33/22 |
| 2019/0051637 A1 | 2/2019 | Lo et al. |
| 2019/0051792 A1 | 2/2019 | Lo et al. |
| 2019/0088821 A1 | 3/2019 | Oike et al. |
| 2019/0139794 A1 | 5/2019 | Saketi et al. |
| 2020/0128708 A1* | 4/2020 | Saketi ................ G02B 27/62 |
| 2020/0303585 A1 | 9/2020 | Lo et al. |

OTHER PUBLICATIONS

U.S. Appl. No. 16/600,896, "Final Office Action", dated Mar. 3, 2021, 15 pages.
U.S. Appl. No. 16/600,896, "Non-Final Office Action", dated Oct. 28, 2020, 11 pages.
U.S. Appl. No. 16/595,870, "Non-Final Office Action", dated May 28, 2021, 8 pages.
U.S. Appl. No. 16/600,896, "Notice of Allowance", dated Jun. 23, 2021, 8 pages.

* cited by examiner

MANUFACTURE OF SEMICONDUCTOR DISPLAY DEVICE

CROSS-REFERENCE TO RELATED APPLICATIONS

This application claims the benefit of U.S. Provisional Application No. 62/747,499, filed Oct. 18, 2018, entitled "Manufacture of Semiconductor Display Device" which is incorporated herein by reference in its entirety.

BACKGROUND

The disclosure relates generally to display technologies, and more specifically to the fabrication of displays devices including light emitting diodes.

Displays are ubiquitous and are a core component of wearable devices, smart phones, tablets, laptops, desktops, TVs and display systems. Common display technologies today range from Liquid Crystal Displays (LCDs) to Light Emitting Diode (LED) displays. To fabricate a display, an array of LCD or LED display elements can be assembled, and the array of display elements can be transferred onto a backplane to form the display. The processes used for assembly and transferring the display elements onto the backplane can be a factor in determining the speed and the yield of the display manufacturing process.

SUMMARY

The present disclosure relates to display technologies. More specifically, and without limitation, this disclosure relates to a method of assembling and transferring a set of LED devices to a backplane (e.g., a display backplane) to form a display. The method may include forming a plurality of light emitting diode (LED) dies on a starter substrate; holding, using a pick up tool (PUT), the starter substrate having the LED dies; moving, using the PUT, the starter substrate and the plurality of LED dies towards a backplane to bring the one or more LED dies into contact with the backplane at a plurality of contact locations; establishing conductive bonds between the plurality of LED dies and the backplane at the one or more contact locations; and operating the PUT to release the starter substrate to enable transferring of the plurality of LED dies to the backplane.

In some aspects, a method of manufacturing light emitting diodes (LED) devices is provided. The method comprises: forming a plurality of light emitting diode (LED) dies on a starter substrate, each of the plurality of LED dies including a device-side bump; holding, using a pick up tool (PUT), the starter substrate having the LED dies; moving, using the PUT, the starter substrate and the plurality of LED dies towards a backplane, the backplane including a plurality of backplane-side bumps at a plurality of contact locations corresponding to the plurality of LED dies, the moving of the starter substrate and the plurality of LED dies towards the backplane enables conductive bonds to be established between the plurality of backplane-side bumps and the device-side bumps of the LED dies; establishing the conductive bonds between the device-side bumps of the plurality of LED dies and the backplane-side bumps of the backplane at the plurality of contact locations, to provide electrical conductivity between the device-side bumps of the plurality of LED dies and the backplane-side bumps of the backplane at the plurality of contact locations; and operating the PUT to release the starter substrate to enable transferring of the plurality of LED dies to the backplane.

In some aspects, the plurality of LED dies forms a first strip having a first width along a first axis and a first length along a second axis. The starter substrate has a second width along the first axis. The first width is of several orders of magnitude below the first length, and the second width is of several orders of magnitude above the first width.

In some aspects, the PUT comprises a holding device having a dimension that is of several orders of magnitude above a dimension of each of the plurality of LED dies. In some aspects, the PUT comprises at least one of: a vacuum PUT or a stamp PUT. The method may further comprises: adhering a stamp of the stamp PUT to the starter substrate using an adhesive material; and moving the stamp to bring the starter substrate towards the backplane. In some aspects, the stamp of the stamp PUT is adhered to the starter substrate at an adhesion location of the starter substrate, the adhesion location being determined to enable the starter substrate to block the adhesive material from reaching a surface of the backplane to which the plurality of LED dies are conductively bonded.

In some aspects, the method further comprises: operating the PUT to control an orientation of the starter substrate when moving the starter substrate to control orientations of the plurality of LED dies when the device-side bumps of the plurality of LED dies are brought into contact with backplane-side bumps of the backplane at the plurality of contact locations.

In some aspects, the plurality of LED dies forms a first LED strip, the starter substrate is a first starter substrate, and the plurality of contact locations is a plurality of first contact locations. The method further comprises: removing the first starter substrate from the first LED strip after the conductive bonds are established; forming a second LED strip on a second starter substrate; moving, using the PUT, the second starter substrate towards the backplane to enable conductive bonds to be established between device-side bumps of the second LED strip and backplane-side bumps at a plurality of second contact locations of the backplane; and establishing conductive bonds between the device-side bumps of the second LED strip and the backplane-side bumps of the backplane at the plurality of second contact locations, to provide electrical conductivity between the device-side bumps of the second LED strip and the backplane-side bumps of the backplane at the plurality of second contact locations.

In some aspects, the method further comprises: forming a third LED strip on a third starter substrate; moving, using the PUT, the third starter substrate towards the backplane to enable conductive bonds to be established between device-side bumps of the third LED strip and backplane-side bumps at a plurality of third contact locations of the backplane; and establishing conductive bonds between the device-side bumps of the third LED strip and the backplane-side bumps of the backplane at the plurality of third contact locations, to provide electrical conductivity between the device-side bumps of the third LED strip and the backplane-side bumps of the backplane at the plurality of third contact locations.

In some aspects, the plurality of first contact locations, the plurality of second contact locations, and the plurality of third contact locations are pre-configured such that: the first LED strip is assembled as a red LED strip on the backplane, the second LED strip is assembled as a blue LED strip on the backplane, the third LED strip is assembled as a green LED strip on the backplane, and the red LED strip, the blue LED strip, and the green LED strips form a group of three parallel LED strips on the backplane.

In some aspects, the second starter substrate and the third starter substrate are moved together towards the backplane by the PUT to bring the second LED strip and the third LED strip towards the backplane simultaneously. In some aspects, the second starter substrate and the third starter substrate are moved towards the backplane at different times.

In some aspects, the first starter substrate comprises a gallium arsenide material. The second starter substrate comprises a sapphire material. The first LED strip includes LED devices having a light emitting layer to emit red light. The second LED strip includes LED dies having a light emitting layer to emit green light or blue light.

In some aspects, the first starter substrate is removed by etching, after establishing the conductive bonds between the first LED strip and the backplane.

In some aspects, the method further comprises: removing the second starter substrate from the second LED strip, after establishing the conductive bonds between the second LED strip and the backplane.

In some aspects, removing the second starter substrate from the second LED strip comprises: projecting laser light via the second starter substrate to weaken bonding between the second starter substrate and the second LED strip; and moving the second starter substrate away from the second LED strip to break the weakened bonding.

In some aspects, the second LED strip is brought towards the backplane to establish conductive bonding between device-side bumps of the second LED strip and backplane-side bumps of the backplane at the plurality of second contact locations after establishing the conductive bonds between the device-side bumps of the first LED strip and the backplane-side bumps of the backplane at the plurality of first contact locations.

In some aspects, the second LED strip is formed closer to a longitudinal edge of the second starter substrate than to a longitudinal center line of the second starter substrate, the longitudinal edge and the longitudinal center line being parallel with the second axis.

In some aspects, the first LED strip is brought towards the backplane to establish conductive bonding between the device-side bumps of the first LED strip and backplane-side bumps of the backplane at the plurality of first contact locations when conductive bonding is established between the device-side bumps of the second LED strip and the backplane-side bumps of the backplane at the plurality of the second contact locations. In some aspects, the second LED strip is formed along a longitudinal center line of the second starter substrate, the longitudinal center line being parallel with the second axis.

BRIEF DESCRIPTION OF THE DRAWINGS

Illustrative embodiments are described with reference to the following figures.

Figure 1:
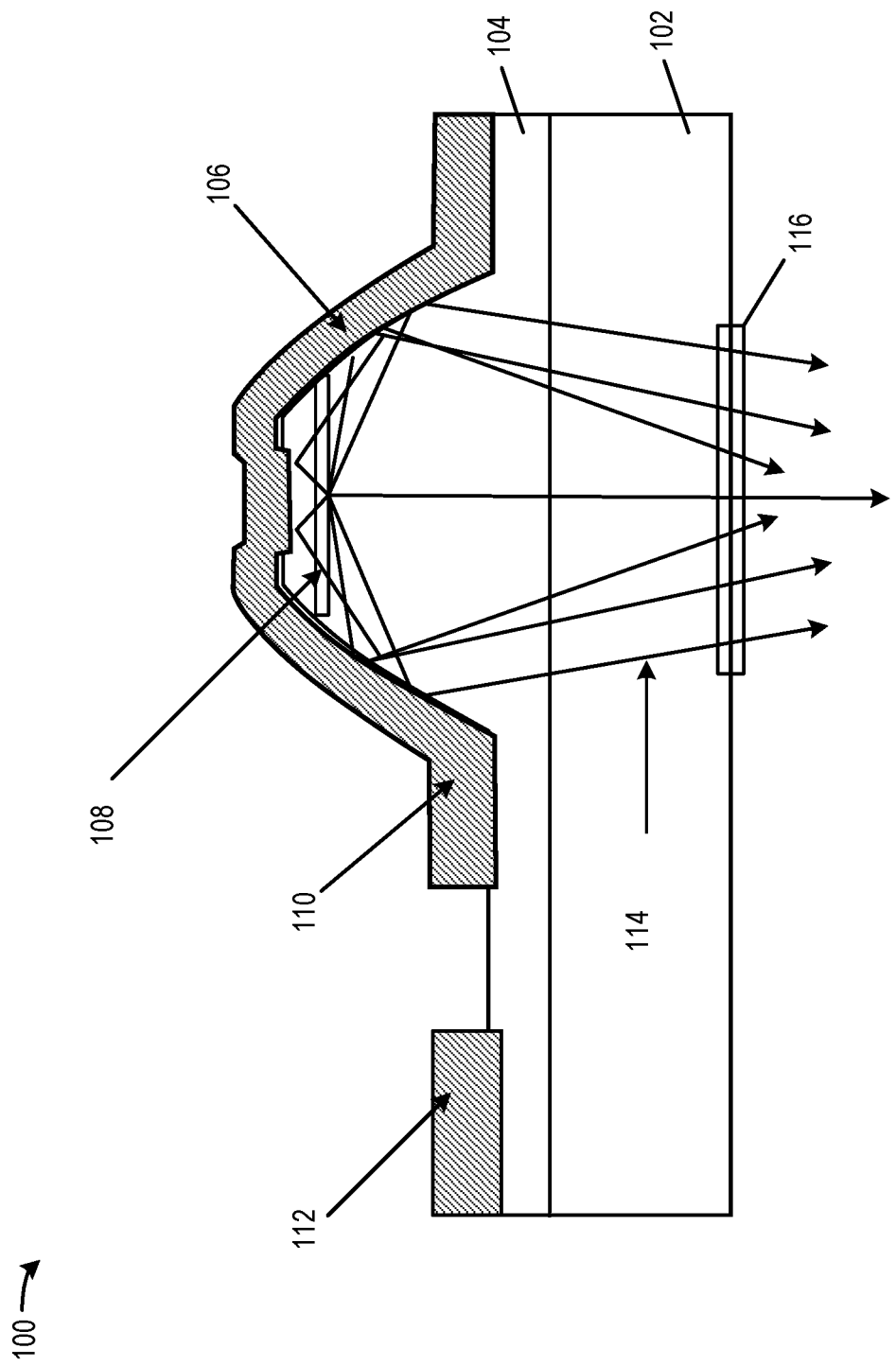
FIG. 1 shows a cross-sectional view of an example LED device that can be manufactured using examples of the disclosed techniques.

The figures depict examples of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In the following description, for the purposes of explanation, specific details are set forth in order to provide a thorough understanding of certain inventive embodiments. However, it will be apparent that various embodiments may be practiced without these specific details. The figures and description are not intended to be restrictive.

Common display technologies today range from Liquid Crystal Displays (LCDs) to more recent Organic Light Emitting Diode (OLED) displays and Active Matrix Organic Light Emitting Diode (AMOLED) displays. Inorganic Light Emitting Diodes (ILEDs) are emerging as the third generation of flat display image generators based on superior battery performance and enhanced brightness. A "μLED," or "MicroLED," described herein refers to a particular type of ILED having a small active light emitting area (e.g., less than 2,000 μm$^2$) and, in some examples, being capable of generating directional light to increase the brightness level of light emitted from the small active light emitting area. In some examples, a micro-LED may refer to an LED that has an active light emitting area that is less than 50 μm, less than 20 μm, or less than 10 μm. In some examples, the linear dimension may be as small as 2 μm or 4 μm.

ILED displays can be manufactured using different processes from OLED displays. For example, OLED devices are fabricated directly onto a display substrate. In contrast, ILED devices are fabricated separately from the display substrate. The base material of ILED devices base material is grown on a crystalline substrate to form an LED starter wafer. The LED starter wafer can be processed through various steps to produce individual LED dies, with each LED die including an LED device. Once fabricated, the LED dies can be transferred from the carrier substrate to a backplane. The backplane can be a display backplane of a display device, which may include a flexible substrate such as polymers, or a rigid substrate such as Thin Film Transistor (TFT) glass substrate. As part of the transfer process, the LED dies can also be assembled to form a display element which corresponds to a pixel or a sub-pixel of a display. A final display may comprise one or more display elements.

The process of assembling (or manufacturing) a display element by transferring LED dies from a carrier substrate to a backplane may include the use of a Pick Up Tool (PUT) configured to pick up LED dies from the carrier substrate, transfer them to the display substrate and place them on the display substrate, a process termed "pick-and-place." The PUT can pick up an LED die (or a strip of LED dies) from the carrier substrate by applying an attractive force, hold the LED die in place until the force is reduced to release the dies, and remove or reverse the force of attraction to eject the LED die to the display substrate. A challenge associated with the use of the PUT is the ability to control the forces adhering and releasing the dies at small scales so as not to break the fragile LED dies, and to hold the dies such that the dies are held in a proper orientation (e.g., being upright rather than being tiled) and at a proper location (e.g., right above pre-determined target locations on the backplane) before the PUT releases the dies onto the backplane. The precise control of both the orientations and locations of the LED dies are essential. For example, the orientations of the LED dies affect the direction of propagation of light emitted by the LED dies, and precise control of the orientations is needed to ensure proper and deterministic propagation direction of light emitted by the LED dies. Moreover, the precise control of the locations of the LED dies allows more LED dies to be placed within a display area, which improves the display resolution of the display.

Conventional PUT techniques, such as vacuum PUT, stamp PUT, etc., are not suitable for handling the LED dies directly in the pick-and-place process. For example, a vacuum PUT includes a suction cup configured as a holding device to hold or release an object using an air suction force. The suction cup for a standard vacuum PUT may be too big to engage and hold onto an LED die surface, and a special vacuum PUT with a microscopic suction cup may be needed to handle LED dies. Moreover, it is also difficult to scale the air suction force to provide the precision needed to handle small LED dies, to avoid breaking the fragile LED dies and to hold the LED dies in a proper orientation and in a proper location when releasing the LED dies onto the backplane. On the other hand, a stamp PUT may include a stamp configured as a holding device. Adhesives can be applied to adhere the LED dies to the stamp to enable the stamp to hold the LED dies. The adhesives can be melted (e.g., by heat, by laser light in a laser lift off (LLO) process, etc.) to release the LED dies. The adhesives, however, may drip onto the backplane and prevent the transfer of other LED dies to the backplane. There may also be a need for a special micro-scale stamp PUT with a microscopic stamp to handle the LED dies. Further, it is also difficult to control the stamp with a sufficiently-high precision to avoid breaking the fragile LED dies and to hold the LED dies in a proper orientation and in a proper location.

This disclosure relates to a method of assembling and transferring a set of LED devices to a backplane (e.g., a display backplane) to form a display. The method may include forming a plurality of light emitting diode (LED) dies on a starter substrate. The LED dies and the substrate may form a monolithic semiconductor structure. As used herein, a monolithic semiconductor structure may refer to a single, unified piece of semiconductor structure in which the components are bonded together. The method may further include holding, using a pick up tool (PUT), the monolithic structure including the starter substrate and the LED dies; moving, using the PUT, the monolithic structure towards a backplane to enable device-side bumps of one or more LED dies to be conductively bonded with backplane-side bumps of the backplane at a plurality of contact locations; establishing conductive bonds between the plurality of LED dies and the backplane at the one or more contact locations; and operating the PUT to release the monolithic structure to enable transferring of the plurality of LED dies to the backplane from the starter substrate.

The aforementioned method can be extended to assembling multiple strips of LED devices on a backplane to fabricate, for example, a scanning display. Strips of LED devices for emitting visible lights of different colors (e.g., red LED dies, blue LED dies, and green LED dies) can be formed on different starter substrates as a separate monolithic semiconductor structure. For example, one or more strips of red LEDs can be fabricated on a gallium arsenide substrate to form a first monolithic semiconductor device. Also, one or more strips of green LEDs and blue LEDs can be fabricated on separate sapphire or aluminum oxide ($Al_2O_3$) substrates to form a second and a third monolithic semiconductor device. A PUT can be operated to hold and move each of first, second, and third monolithic semiconductor devices to a backplane to transfer the strips of LED dies onto the backplane. After conductively bonding the strips of the LED dies onto the backplane, the starter substrates can be removed from the strips of LED dies. For example, the Gallium Arsenide substrate can be etched away, whereas the sapphire substrate can be removed by laser lift-off (LLO) processes.

With the disclosed techniques, the starter substrate can be used to provide an intermediary device between the LED dies and the PUT, to facilitate the handling and transfer operations by the PUT. For example, the starter substrate provides a much larger area to engage with the holding device with the PUT (e.g., the suction cup of a vacuum PUT, the stamp of a stamp PUT, etc.) than individual LED dies, which enables use of a standard PUT (instead of a microscopic PUT) for handling and transfer of LED dies. Moreover, the larger engagement area also facilitates precise control of the orientations and locations of the LED devices when the devices are released onto the backplane. For example, the orientations and locations of the LED devices relative to the backplane can be defined by the orientations and locations of the LED devices as formed on the starter substrate. Therefore, by controlling the orientation and location of the starter substrate with respect to the backplane, the orientation and location of each LED device as the device is placed on the backplane can be precisely controlled as well.

Moreover, the use of the starter substrate as an intermediary device can also improve the reliability of the transfer and handling operations. For example, the starter substrate can provide structural support for the fragile LED dies (and strip of LED dies) during the handling operations of the PUT. Moreover, given that the PUT does not engage the LED dies directly, the likelihood of the PUT damaging or even breaking the LED dies can also be reduced. Further, in a case where adhesives are used for a stamp PUT, the starter substrate can also act as a shield to block the adhesives from dripping onto the backplane. All these can improve the efficiency and yield of the manufacture of the displays.

Examples of the present disclosure may include, or be implemented in conjunction with, an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world)

content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers. Examples of the present disclosure may be used to implement, for example, a display system in an HMD, a mobile device, a computing system, or any other hardware platform capable of providing artificial reality content to one or more viewers.

FIG. 1 shows a cross-sectional view of a μLED 100 according to some examples of the present disclosure. As shown in FIG. 1, μLED 100 includes, among others, a substrate 102, a semiconductor epitaxial layer 104 disposed on the substrate 102. Epitaxial layer 104 can be shaped into a mesa 106. an active layer 108, which can include quantum well structures configured to emit light of a pre-determined wavelength range when activated, can be included in mesa 106. Mesa 106 has a truncated top covered by a P-type contact pad 110, whereas a part of epitaxial layer 104 outside of mesa 106 may be covered by an N-type contact pad 112. An electric signal can be applied across P-type contact pad 110 and N-type contact pad 112 to activate active layer 108 to emit light 114. Moreover, mesa 106 also has a near-parabolic shape to form a reflective enclosure. The near-parabolic structure of mesa 106 can be etched directly onto the LED die during the wafer processing steps. Mesa 106 for a typical μLED can have a diameter of about 50 micrometers (μm) or less, whereas each of P-type contact pad 110 and N-type contact pad 112 may have a diameter of about 20 μm.

Light 114 emitted from active layer 108 can be reflected off the internal walls of mesa 106 toward light emitting surface 116 at an angle sufficient for the light to escape the μLED die 100 (i.e., within an angle of total internal reflection). Light 114 can form a quasi-collimated light beam as the light emerges from light emitting surface 116.

Figure 2A:
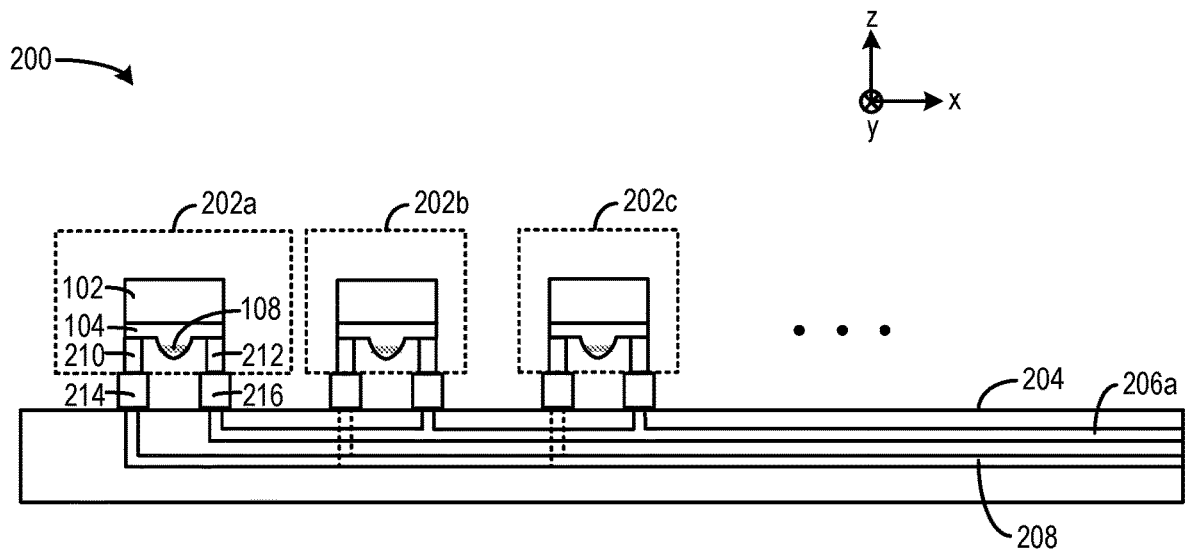
FIG. 2A, FIG. 2B, FIG. 2C, and FIG. 2D are schematic views of an example display that can be manufactured using examples of the disclosed techniques.
Figure 2B:
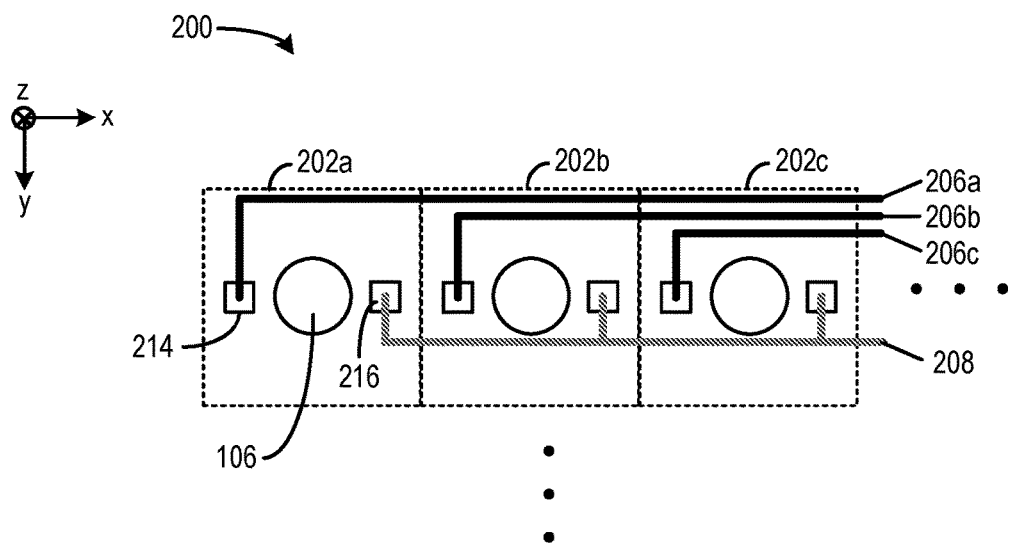

FIG. 2A and FIG. 2B show an example of a μLED display apparatus 200 according to some examples of the present disclosure. Although the examples of FIG. 2A and FIG. 2B are based on μLED devices, it is understood that the examples of FIG. 2A and FIG. 2B are applicable to other types of LED devices as well. FIG. 2A shows a cross-sectional view of the display apparatus, whereas FIG. 2B shows a top view of the display apparatus. As shown in FIG. 2A, μLED display 200 can include an array of μLED dies 202 including, for example, μLED die 202a, μLED die 202b, and μLED die 202c assembled on a backplane 204.

Backplane 204 may include a structure for attaching a plurality of μLED dies, to provide electrical connections and structural support for the plurality of μLED devices. As used herein, "backplane" may refer to any structure that provides a surface (which can be planar, curved, etc.) for attaching a plurality of LED devices (which may include μLED devices as described in this disclosure) and for providing electrical signals to the plurality of LED devices. The backplane can be configured as a display backplane to form a display device. For example, the backplane can hold assemblies of LED devices forming display elements, and the backplane may also include traces to provide electrical signals to the LED devices to control the information displayed by the display elements. Backplane 204 may comprise traces, which may connect to other components. Backplane may also comprise electrical contact points, e.g., metal pads, which may provide access to the traces. For example, as shown in FIG. 2A and FIG. 2B, backplane 204 includes electrical traces 206a, 206b, and 206c to couple with, respectively, μLED die 202a, μLED die 202b, and μLED die 202c. Electrical traces 206a, 206b, and 206c allow each of μLED die 202a, μLED die 202b, and μLED die 202c to be individually controlled by applying different signals. Backplane 204 also includes an electrical trace 208 to act as a return current path for each of μLED die 202a, μLED die 202b, and μLED die 202c. Backplane 204 may include different kinds of materials, such as Thin Film Transistor (TFT) glass substrate, polymer, polychlorinated biphenyl (PCB), etc. Although FIG. 2A illustrates that backplane 204 has a rectangular shape, it is understood that backplane 204 can have various shapes and sizes.

Each of μLED die 202a, μLED die 202b, and μLED die 202c can have a structure similar to μLED die 100 of FIG. 1. Each μLED die in FIG. 2A and FIG. 2B may include substrate 102, epitaxial layer 104, mesa 106, and active layer 108. In addition, each μLED die includes a device-side bump 210 and a device-side bump 212. While FIG. 2A and FIG. 2B illustrate that the bumps are of rectangular shape, it is understood that the bumps can take on other shapes including, for example, rounded shapes, dome shapes, etc. Device-side bump 210 can be connected to P-type contact pad 110 (not shown in FIG. 2A and FIG. 2B), whereas device-side bump 212 can be connected to N-type contact pad 112 (also not shown in FIG. 2A and FIG. 2B). Moreover, backplane 204 includes backplane-side bumps at each location for placing a μLED die. For example, backplane 204 includes backplane-side bumps 214 and 216 for μLED die 202a. Backplane 204 also includes metal pads (not shown in FIG. 2A) which serve as a foundation on which backplane-side bumps 214 and 216 are deposited, and to provide electrical contact to traces 206 and 208. Conductive bonding (e.g., metallic bonding) can be formed between the bumps of the μLED dies and the contacts to provide electrical paths between the μLED die and backplane 204.

Figure 2C:
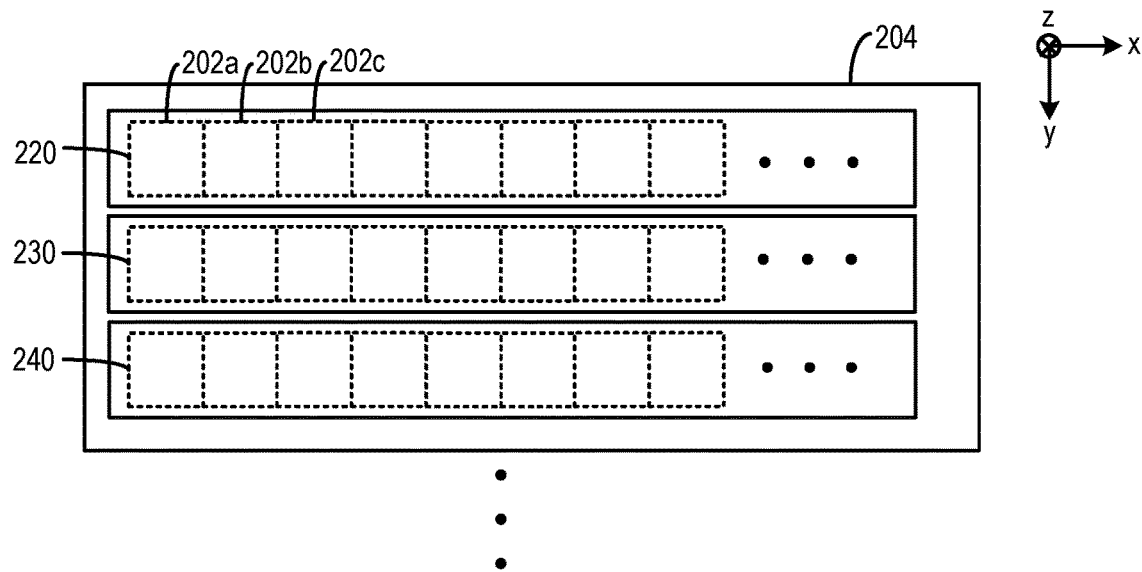
Figure 2D:
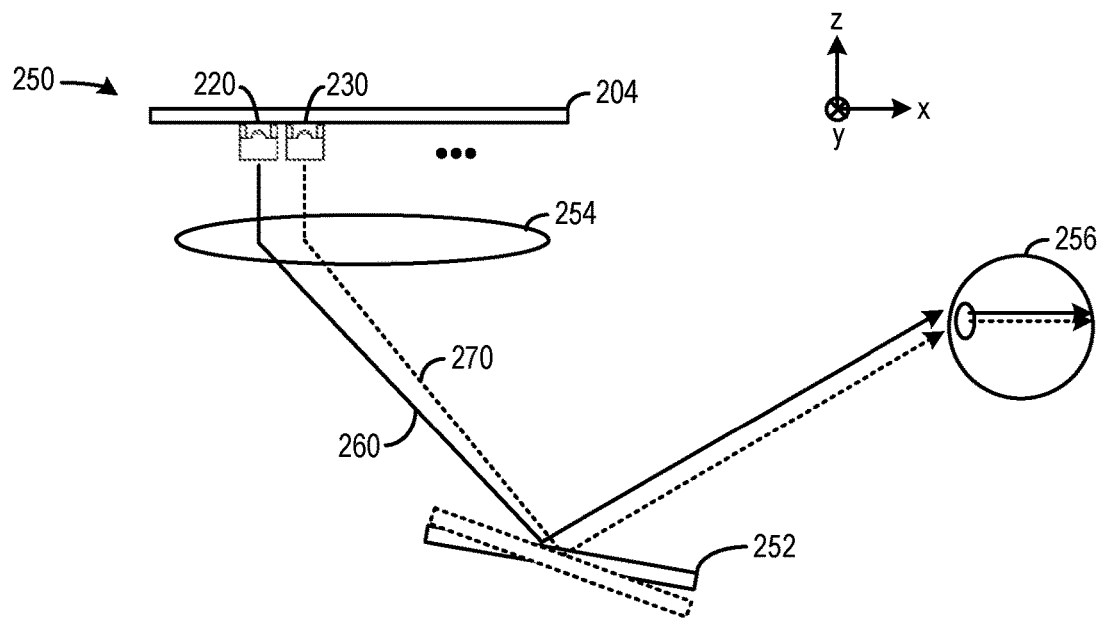

In some examples, μLED display apparatus 200 can be configured as a scanning display in which the LEDs configured to emit light of a particular color are formed as a strip (or multiple strips). For example, as shown in FIG. 2C, a plurality of μLED dies including μLED die 202a, μLED die 202b, and μLED die 202c, etc. can be assembled along an X-axis to form a μLED strip 220 configured to emit green light on backplane 204. In addition, backplane 204 also includes a μLED strip 230 configured to emit red light and an LED strip 240 configured to emit blue light.

μLED strips 220, 230, and 240, as well as additional strips of red, green and blue μLEDs, can be assembled along a Y-axis as parallel strips on backplane 204 to form a scanning display. FIG. 2D illustrates an example of a scanning display 250 comprising μLED display apparatus 200, a mirror 252, and a lens 254. In scanning display 250, each strip of LEDs can be configured to emit light of a particular color (e.g., one of red, green, or blue). For example, μLED strip 220 can emit green light 260, μLED strip 230 can emit red light 270, etc. The lights can be converged by lens 254 and reflected by mirror 252 into eyeball 256 of a person. To perform sequential scanning, each strip of LEDs can be controlled to emit light to project a line of pixels of an image onto the retina of eyeball 256. The projection of each line of pixels can be sequential. Through the rotating action of mirror 252, each line of pixels can be projected at different points at different times on the retina, to create the perception of the image.

Figure 3A:
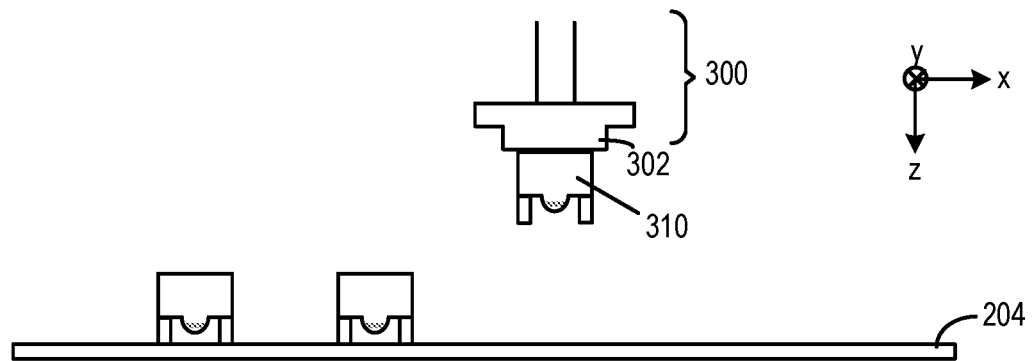
FIG. 3A, FIG. 3B, and FIG. 3C illustrate an example process of transferring LED dies to a backplane.
Figure 3B:
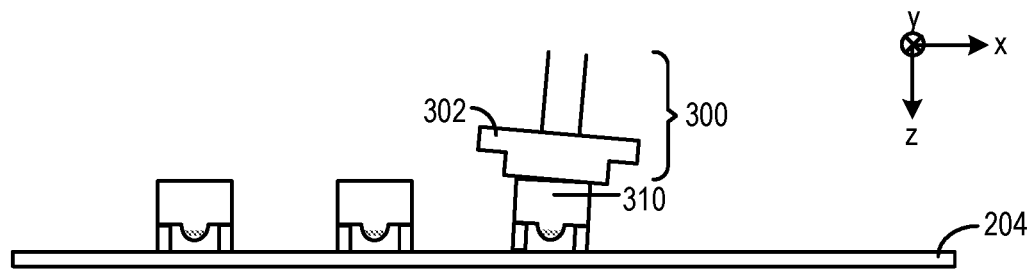
Figure 3C:
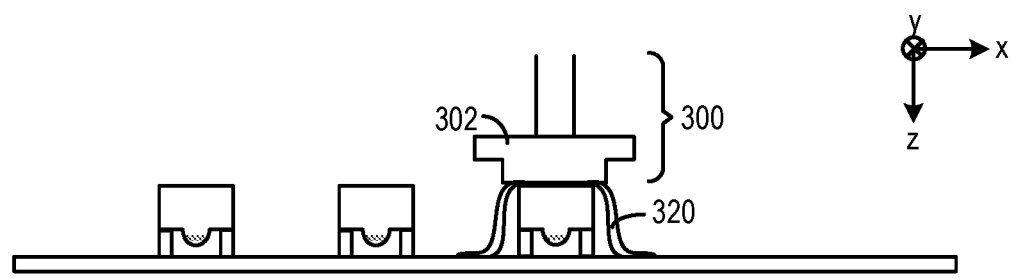

FIG. 3A-FIG. 3C illustrate examples of a pick-and-place process of μLED dies performed using a PUT. Although FIG. 3A-FIG. 3C illustrate handling of μLED dies, it is understood that the illustrated examples are also applicable to the handling of other types of LED dies/devices. In the example of FIG. 3A, a PUT 300, which can be a vacuum PUT, a stamp PUT, etc., can include a holding device 302 (e.g., a suction cup, a stamp, etc.) to hold or release a μLED die (e.g., μLED die 202c) or a long and narrow strip of μLED dies (e.g., μLED strip 230) onto backplane 204. As shown in FIG. 3A, holding device 302 may be a microscopic device having dimensions similar to a μLED die (e.g., having a width or a length in the range of micrometers) to handle a μLED die or a strip of μLED dies (represented by μLED 310 in FIG. 3A) directly. A standard PUT may be unsuitable for handling the μLED dies directly. For example, the suction cup or stamp of a standard PUT may be too large to engage a μLED die surface. Moreover, the challenges associated with using a standard PUT (or a microscopic PUT) to handle a long and narrow strip of μLED dies (e.g., μLED strip 220) can be significantly more than handling of a single a μLED die. This can be because the width of a μLED strip is the same as a single μLED die, therefore the lack of engaging surface in the case of handling a μLED die is equally applicable to the handling of a μLED strip. Moreover, due to its much longer length and weight, a μLED strip can exert a much greater torque on the point of contact between the μLED strip and the holding device compared with a μLED die. The additional torque substantially complicates the control of the holding device for holding the μLED strip. Furthermore, a μLED strip, with its long and narrow shape, is less mechanically stable and more fragile than a single μLED die. As a result, not only might a standard PUT fail to hold the μLED strip reliably, the PUT may also damage μLED strip during the transfer and release of the μLED strip.

Although the use of microscopic holding device 302 (or a microscopic PUT 300) can avoid some of the problems of using a standard PUT, there remain other challenges with using a PUT to directly engage μLED dies. For example, as shown in FIG. 3B, the PUT needs to be controlled with high precision to hold the μLED dies in a proper orientation (e.g., being upright) and in a proper location when releasing the μLED dies onto the backplane. Without the requisite precision, a μLED die or a strip of μLED dies (represented by μLED 310 in FIG. 3B) may become tilted with respect to the z-axis, which in turn affects the direction of light emission by the μLED die or by the strip of μLED dies. The precise control of the orientation and position of a μLED strip is even more challenging due to the additional torque exerted onto the contact point, as discussed above.

Further, as shown in FIG. 3C, in a case where adhesive 320 is used to adhere the μLED die or the strip of μLED dies to holding device 302, adhesive 320 may drip onto backplane 204. The adhesive may need to be removed from backplane 204 before other μLED dies are transferred onto backplane 204, and the removal process adds delay and complexity to the manufacture process of the display.

Examples of the disclosed techniques include forming a plurality of LED dies (e.g., μLED dies) on a starter substrate. The plurality of LED dies can form a monolithic/unified semiconductor structure with the starter substrate. Subsequently, the PUT can handle the monolithic semiconductor structure to move and transfer the LED dies, and the starter substrate can be used as an intermediary device to engage the PUT during the transfer of the μLED dies onto a backplane (e.g., backplane 204). The starter substrate provides a much larger area to engage with the holding device with the PUT (e.g., the suction cup of a vacuum PUT, the stamp of a stamp PUT, etc.) than individual LED dies, which enables use of a standard PUT (instead of a microscopic PUT) for handling and transfer of LED dies. Moreover, by having the PUT to engage the starter substrate, the forces exerted by the PUT can be scaled up, which can relax the precision requirement for the forces. The relaxed precision requirement enables more effective control of the orientations and locations of the LED devices when the devices are released onto the backplane. The use of the starter substrate as an intermediary device can also improve the reliability of the transfer and handling operations, by providing structural support for the fragile LED dies and strip of LED dies, and by providing a shield to block the adhesive from dripping onto the backplane. All these can improve the efficiency and yield of the manufacture of the displays.

Figure 4:
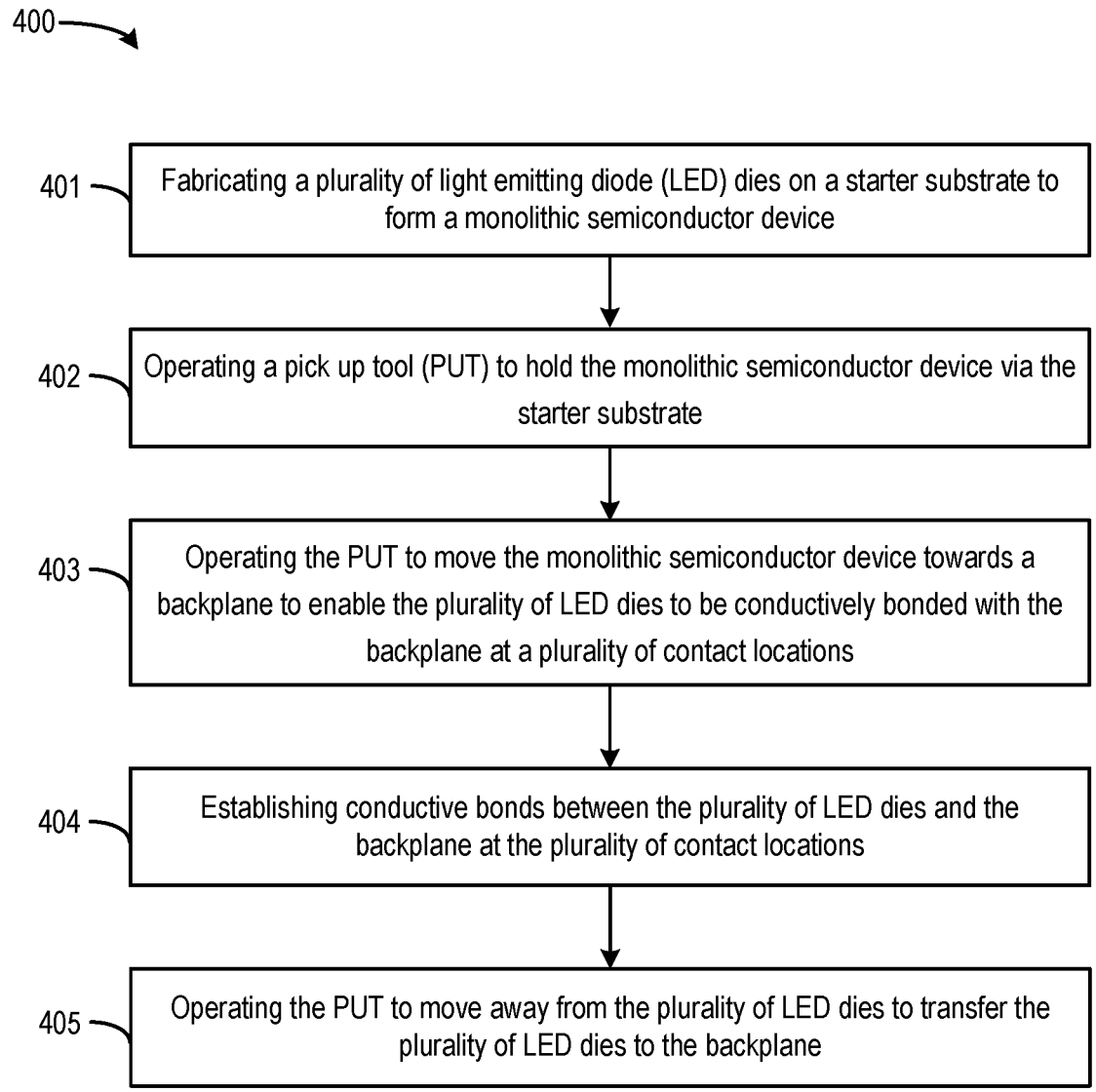
FIG. 4 illustrates an example process of assembling and transferring a plurality of LED dies to a backplane according to examples of the disclosed techniques.

Reference is now made to FIG. 4, FIG. 5A, FIG. 5B, FIG. 5C, and FIG. 5D, which illustrate an example of process 400 for manufacturing and assembling LED dies. FIG. 4 is a flowchart that illustrates examples of the steps of process 400, whereas FIG. 5A, FIG. 5B, FIG. 5C, and FIG. 5D illustrate side views of the semiconductor devices and processing equipment involved in process 400. Process 400 can be used to manufacture and assemble a plurality of μLED dies on a backplane (e.g., backplane 204) using a standard PUT. In some examples, process 400 can be used to assemble a plurality of μLED dies including, for example, μLED dies 202a, 202b, and 202c of FIG. 2A on backplane 204. Process 400 can also be used to form an LED strip (e.g., μLED strip 220, 230, 240, etc. of FIG. 2C) on backplane 204. Although μLED dies are illustrated, it is understood that process 400 can be used to assemble different types of LED devices and is not limited to μLED devices.

Figure 5A:
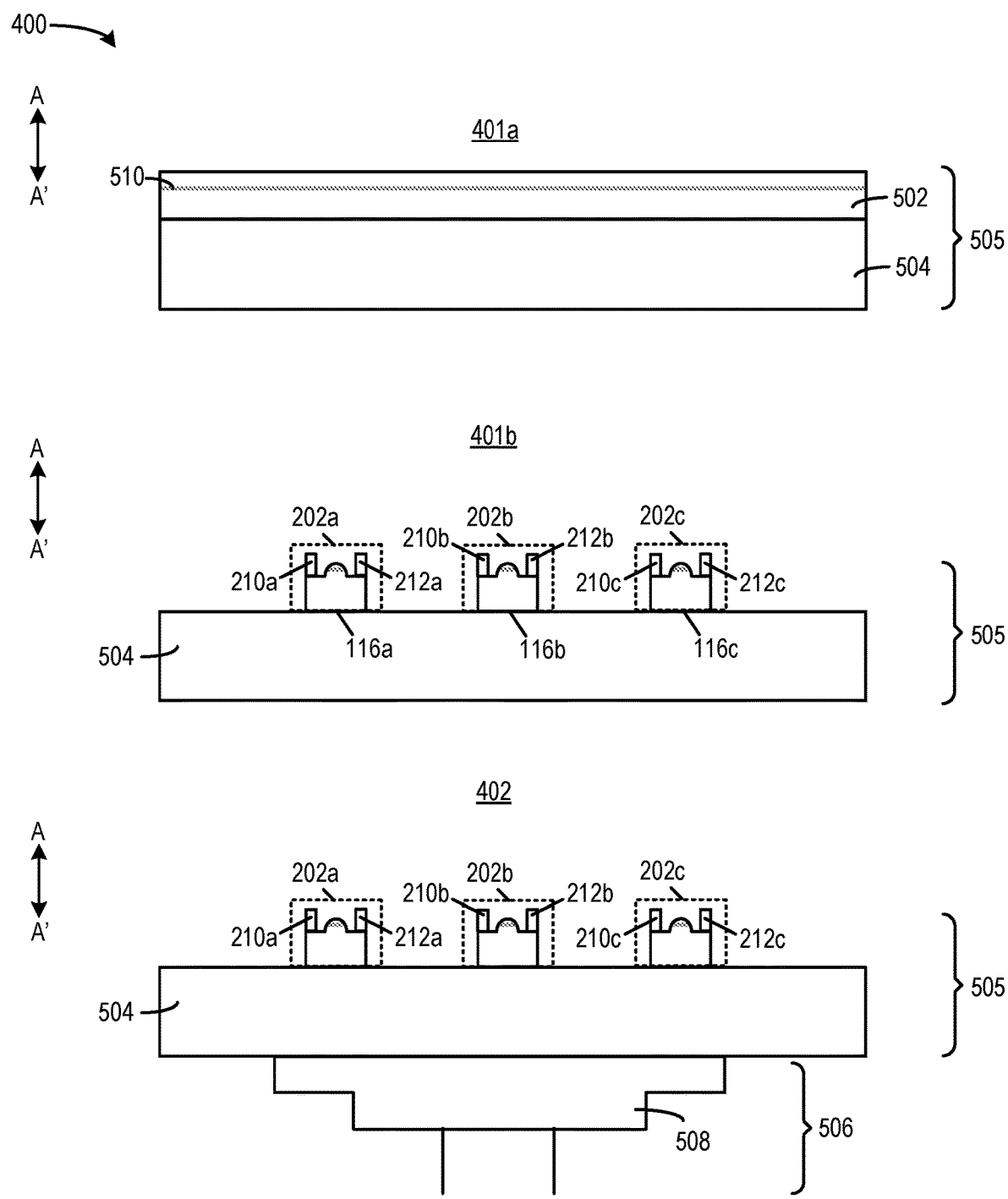
FIG. 5A, FIG. 5B, FIG. 5C, and FIG. 5D are schematic views illustrating the example process of FIG. 4.
Figure 5B:
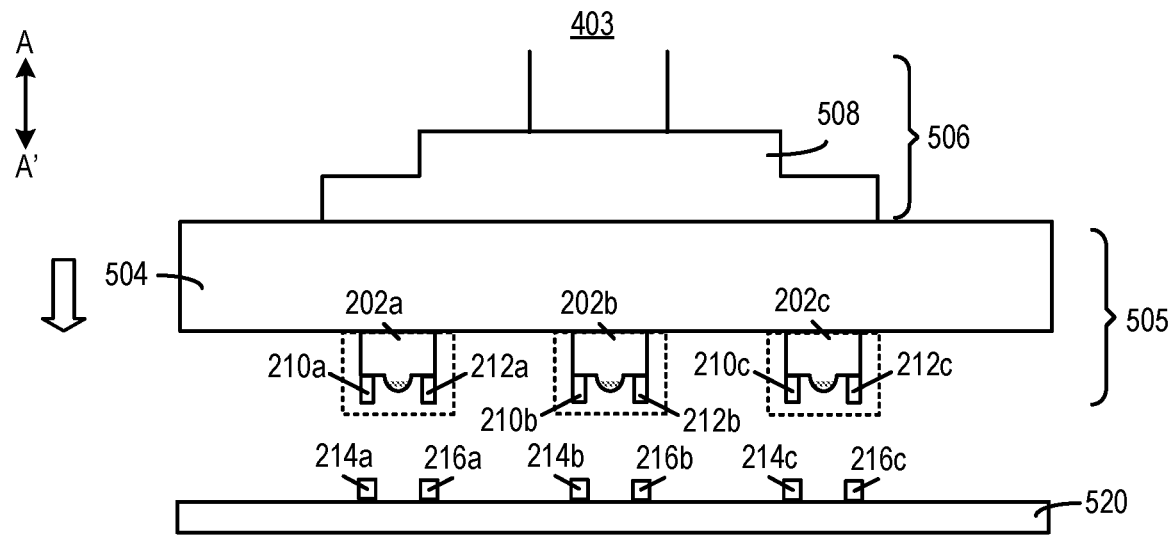
Figure 5B:
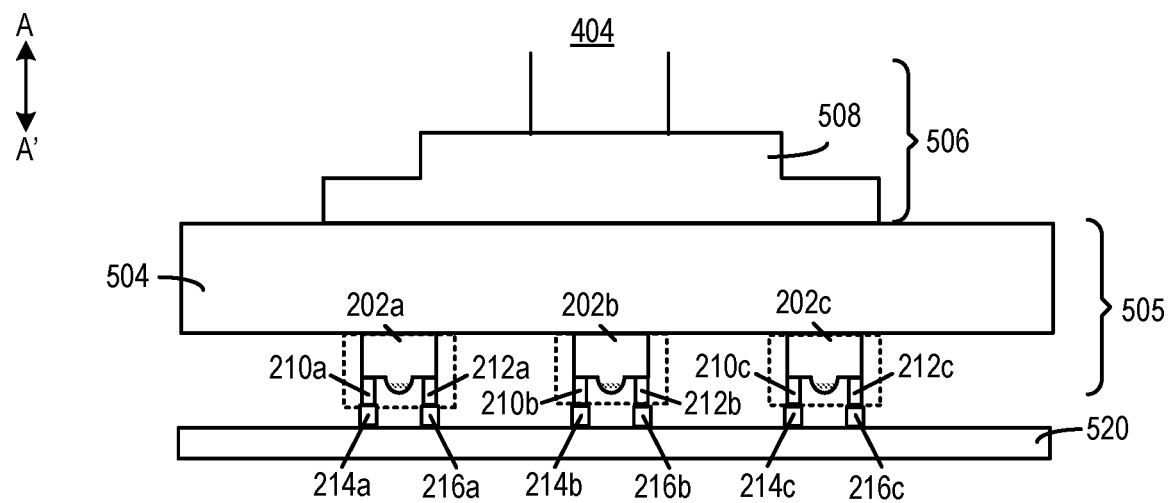
Figure 5C:
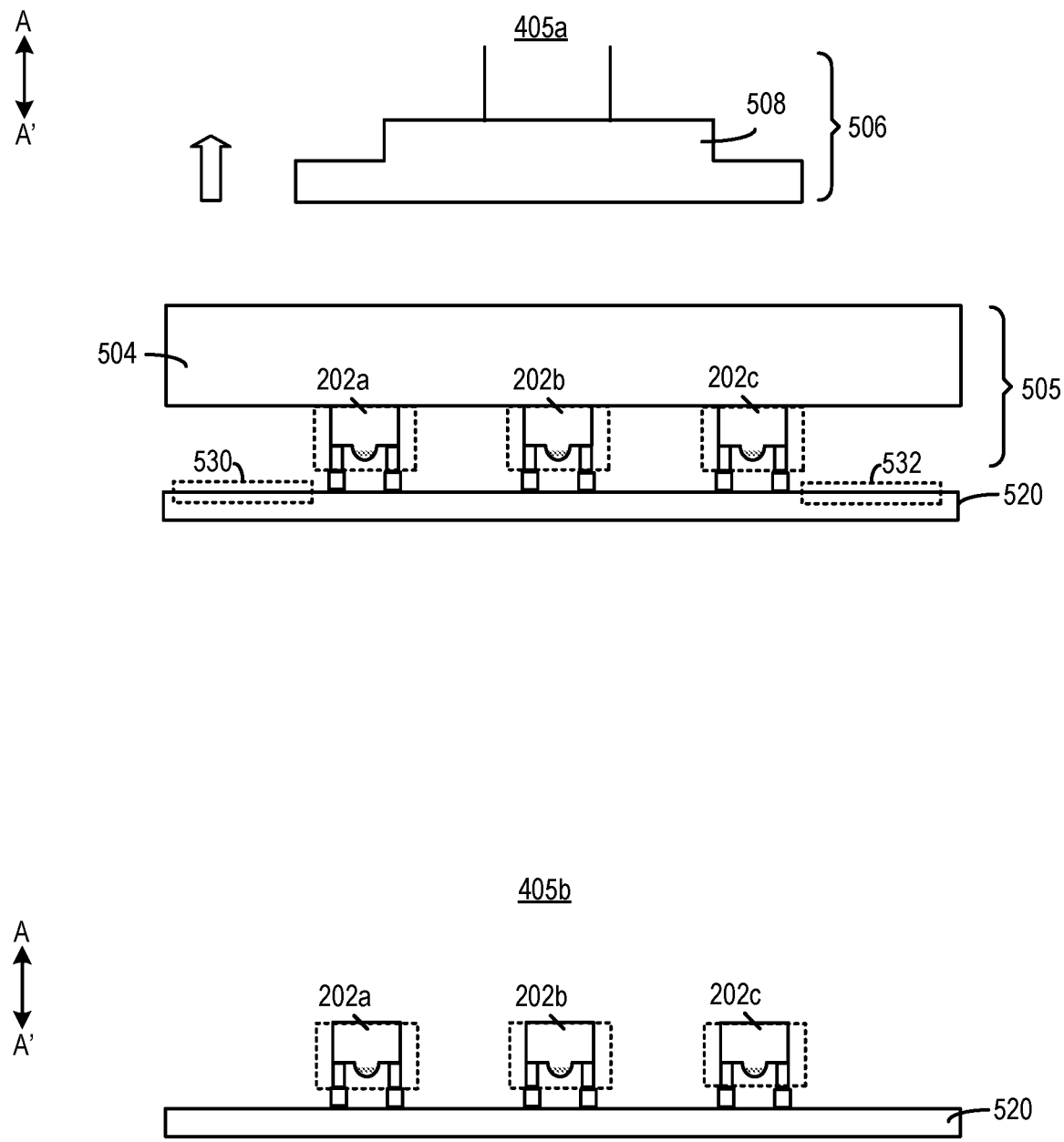
Figure 5D:
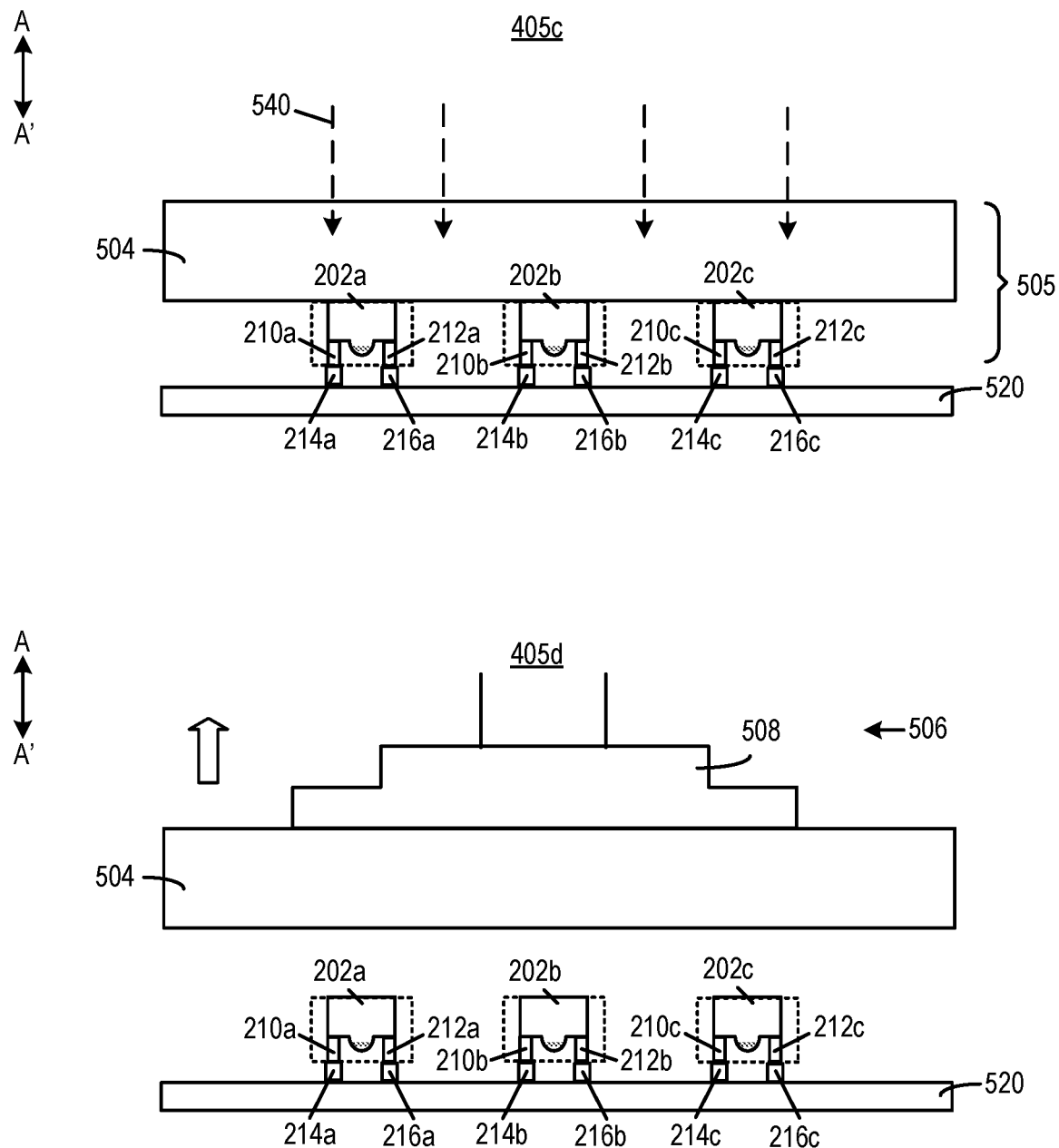

Process 400 starts with step 401, which comprises fabricating a plurality of LED dies on a starter substrate to form a monolithic semiconductor device. Referring to FIG. 5A, step 401 may comprise sub-step 401a, in which an epitaxial layer 502 is grown on a starter substrate 504 to form a monolithic semiconductor device 505. Epitaxial layer 502 includes a light emitting layer 510, which may include a quantum wells structure to generate light of a pre-determined wavelength (e.g., one of red light, green light, or blue light) upon receiving an electrical signal. Sub-step 401a can be followed by sub-step 401b, in which part of epitaxial layer 502 can be etched away to form the one or more light emitting diode (LED) dies including, for example, μLED dies 202a, 202b, and 202c of FIG. 2A. The etching can be performed on a surface of epitaxial layer 502 facing a first direction (e.g., as indicated by the direction A). The etching can create, for example, mesa 106, P-type contact 110, and N-type contact pad 112 of FIG. 1. Light emitting surface 116 (e.g., light emitting surface 116a for μLED die 202a, light emitting surface 116b for μLED die 202b, and light emitting surface 116c for μLED die 202c) can be formed on a surface of epitaxial layer 502 that interfaces with starter substrate 504, as indicated in FIG. 5A. Device-side bumps 210 and 212 (e.g., metallic bumps, conductive epoxy bumps, etc.) can also be formed on each of the μLED dies to provide signals to control the μLEDs to emit light. For example, device-side bumps 210a and 212a can be formed on μLED die 202a, device-side bumps 210b and 212b can be formed on μLED die 202b, and device-side bumps 210c and 212c can be formed on μLED die 202c. The etching of sub-step 401a can form a μLED strip having a length (e.g., along the x-axis) several orders of magnitude larger than its width (e.g., along the y-axis). The width of starter substrate 504, on the other hand, can be several orders of magnitude larger than the width of the μLED strip.

Starter substrate 504 and epitaxial layer 502 may comprise different types of materials, which can also vary depending on the desired light output frequency of the LED being produced. For example, for a blue or green LED, the starter substrate 504 may comprise a sapphire or aluminum oxide ($Al_2O_3$) material, and the epitaxial layer 502 may comprise a gallium nitride (GaN) material. As another example, for a red LED, the starter substrate 504 may comprise opaque (or having low light transmittance) gallium arsenide (GaAs) material, and the epitaxial layer 502 may comprise an aluminum gallium arsenide (AlGaAs) material. Other types of materials may also be used.

In step 402, a pick up tool (PUT), such as a vacuum PUT, a stamp PUT, etc., can be operated to hold the monolithic semiconductor device (formed in step 401) via the starter substrate. Referring to FIG. 5A, a PUT 506 can be used to hold starter substrate 504. PUT 506 can be a standard PUT having a holding device 508 that is several orders of magnitude larger than each of μLED dies 202a, 202b, and 202c.

As discussed above, starter substrate 504 can be configured as an intermediary device between PUT 506 and each of μLED dies 202a, 202b, and 202c, to enable PUT 506 to handle and transfer μLED dies 202a, 202b, and 202c without direct contact with the μLED dies. Compared with FIG. 3A-FIG. 3C where a microscopic PUT (or a PUT with a microscopic holding device) is used to handle the μLED dies directly, in step 402 starter substrate 504 provides a much larger area to engage with the holding device with PUT, which enables use of a standard PUT (instead of a microscopic PUT) for handling and transfer of LED dies. Moreover, the larger engagement area also facilitates precise control of the orientations and locations of the LED devices when the devices are released onto the backplane. For example, as explained above, the orientations and locations of the LED dies relative to backplane 520 can be defined by the orientations and locations of the LED dies as formed on starter substrate 504. Therefore, by controlling the orientation and location of starter substrate 504 with respect to backplane 520, the orientation and location of each LED die placed on backplane 522 can be precisely controlled as well.

In step 403, the PUT can be operated to move the monolithic semiconductor device (including the starter substrate and the plurality of LED dies) towards a backplane, to enable the plurality of LED dies to be conductively bonded with the backplane at a plurality of contact locations. Referring to FIG. 4B, step 403 may include operating PUT 506 to flip monolithic semiconductor device 505 to orient μLED dies 202a, 202b, and 202c towards a second direction (e.g., towards direction A'), such that the device-side bumps 210 and 212 of μLED dies 202a, 202b, and 202c face a backplane 520. Step 403 may also include operating PUT 506 to move monolithic semiconductor device 505 towards backplane 520. Backplane 520 can be a backplane that is part of a display and can have backplane-side bumps 214 and 216 formed on pre-determined contact locations for receiving and bonding with the device-side bumps of μLED dies 202a, 202b, and 202c. For example, bumps 214a and 216a can be preconfigured for bonding with bumps 210a and 212a of μLED die 202a, bumps 214b and 216b are preconfigured for bonding with bumps 210b and 212b of μLED die 202b, and bumps 214c and 216c are preconfigured for bonding with bumps 210c and 212c of μLED die 202c. As monolithic semiconductor device 505 is moved towards backplane 520, the device-side bumps and the backplane-side bumps may be sufficiently close (or in contact) to enable formation of conductive bonding between the two sets of bumps.

In step 404, conductive bonds can be established between the plurality of LED dies and the backplane at the plurality of contact locations. For example, referring to FIG. 5B, PUT 506 can be operated to bring device-side bumps 210 and 212 of μLED dies 202a-202c into contact with the corresponding backplane-side bumps 214 and 216 of backplane 520. At least one of starter substrate 504 or backplane 520 can be subject to heating to form a bond between the bumps. A conductive bonding layer can be formed comprising the backplane-side and device-side bumps to create electrical paths between the μLED dies and electrical traces embedded in backplane 520, to provide control signals to control the μLED devices to emit light.

The use of starter substrate 504 as an intermediary device can improve the reliability of the bonding operation in step 404. For example, by providing a larger engagement area, starter substrate 504 facilitates precise control of operations of PUT 506 to hold μLED dies 202a-202c in an appropriate orientation (e.g., being upright) and at appropriate locations (e.g., at pre-determined contact locations) during the bonding process, to ensure that the μLED dies are connected with the embedded traces and can receive control signals, and that the μLED dies project light at pre-configured directions (rather than at a deviated direction). Further, starter substrate 504 can provide structural support for the fragile μLED dies 202a-202c while the bonding process is underway, and the likelihood of breakage of the μLED dies can be reduced. Starter substrate 504 can also provide structural support and larger engage surfaces for handling of μLED strips, which are even more fragile and more difficult to handle than individual μLED dies as explained above. Moreover, in a case where a stamp PUT is used and an adhesive is applied to the stamp, starter substrate 504 can provide a shield to block the adhesive from dripping onto the backplane. All these can improve the efficiency and yield of the manufacture of the displays.

In step 405, the PUT can be operated to move away from the plurality of LED dies, to transfer the plurality of LED dies to the backplane. For example, referring to FIG. 5C, step 405 may include sub-step 405a, in which PUT 506 can be operated to become separated from starter substrate 504 (and monolithic semiconductor device 505). For example, in a case where PUT 506 is a vacuum PUT, PUT 506 can be operated to generate a reverse air suction force to expel starter substrate 504. Also, in a case where PUT 506 is a stamp PUT, heat can be applied to PUT 506 to melt the adhesive between holding device 508 and starter substrate 504, to weaken the adhesive bond. PUT 506 can then be moved away (e.g., towards the direction A) to become separated from starter substrate 504. The melted adhesive can also be blocked by starter substrate 504 from dripping onto backplane 520, as explained above.

In some examples, sub-step 405a can be followed by an optional sub-step 405b, in which starter substrate 504 is removed from μLED dies 202a-202c. Starter substrate 504 may need to be removed for various reasons. For example, starter substrate 504 can be opaque (e.g., starter substrate 504 including GaAs materials for red LED), or otherwise substantially blocks the light emitting surfaces 116 of μLED dies 202a-202c. As another example, starter substrate 504 may have a certain level of light transmittances, but the starter substrate may cause diffraction which can change the emission direction of the light generated by the μLED devices. As another example, starter substrate 504 may extend over and block off a substantial area (e.g., areas 530 and 532) around μLED dies 202a-202c, which can prevent other μLED dies from being transferred onto areas 530 and 532. In all these examples, starter substrate 504 may need to be removed from μLED dies 202a-202c.

There are different ways of removing starter substrate 504. For example, following the release of PUT 506 in sub-step 405a, starter substrate 504 can be etched away (e.g., using wet etching) to expose the light emitting surfaces 116 of μLED dies 202a-202c, which are conductively bonded to backplane 520, to transfer the μLED dies to the backplane. As another example, referring to FIG. 5D, step 405 may include sub-step 405c, in which a laser lift-off process (LLO) can be performed to project laser light 540 through starter substrate 504 onto the interfaces between starter substrate 504 and each of μLED dies 202a-202c. The laser light can melt the epitaxial material at the interfaces between starter substrate 504 and the μLED dies. The bonding between starter substrate 504 and the μLED dies can be weakened as a result. Sub-step 405c can be followed by sub-step 405d, in which PUT 506 can be operated to move starter substrate 504 away from μLED dies 202a-202c, which remain conductively bonded to backplane 520, to separate starter substrate 504 from the μLED dies 202a-202c.

Process 400 can be extended to fabricating multiple strips of LED devices on a backplane to fabricate, for example, scanning display 250 of FIG. 2D. The multiple strips of LED devices can be configured to emitting visible lights of different colors. For example, scanning display 250 can be fabricated by assembling strips of blue LED devices, strips of red LED devices, and strips of green LED devices in parallel. The strips of LED devices can be fabricated on different starter substrates and then transferred onto backplane 204 using the respective starter substrates as intermediary devices as in process 400 of FIG. 4.

Figure 6:
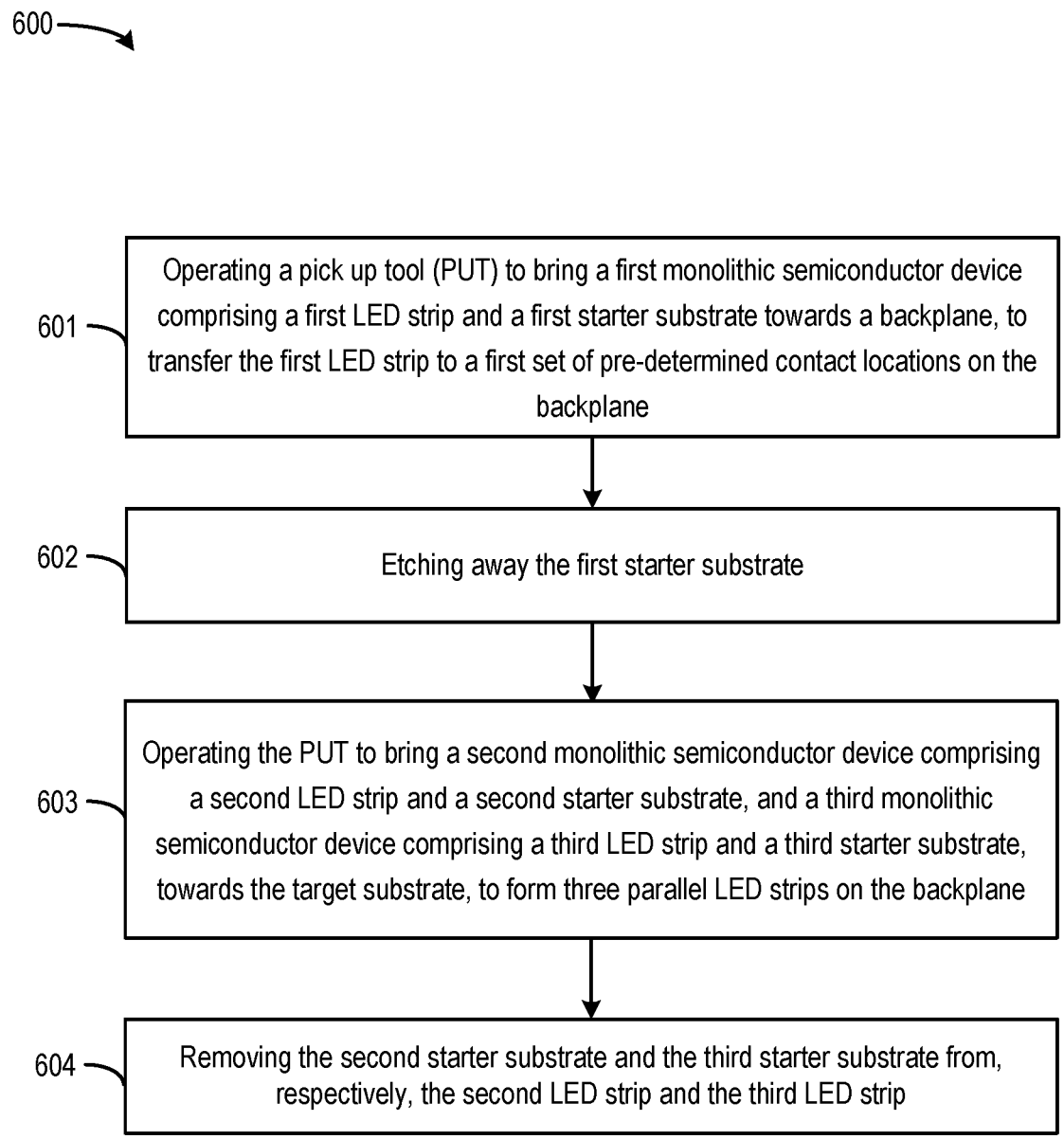
FIG. 6 illustrates an example process of forming multiple strips of LED display elements on a backplane according to examples of the disclosed techniques.
Figure 7A:
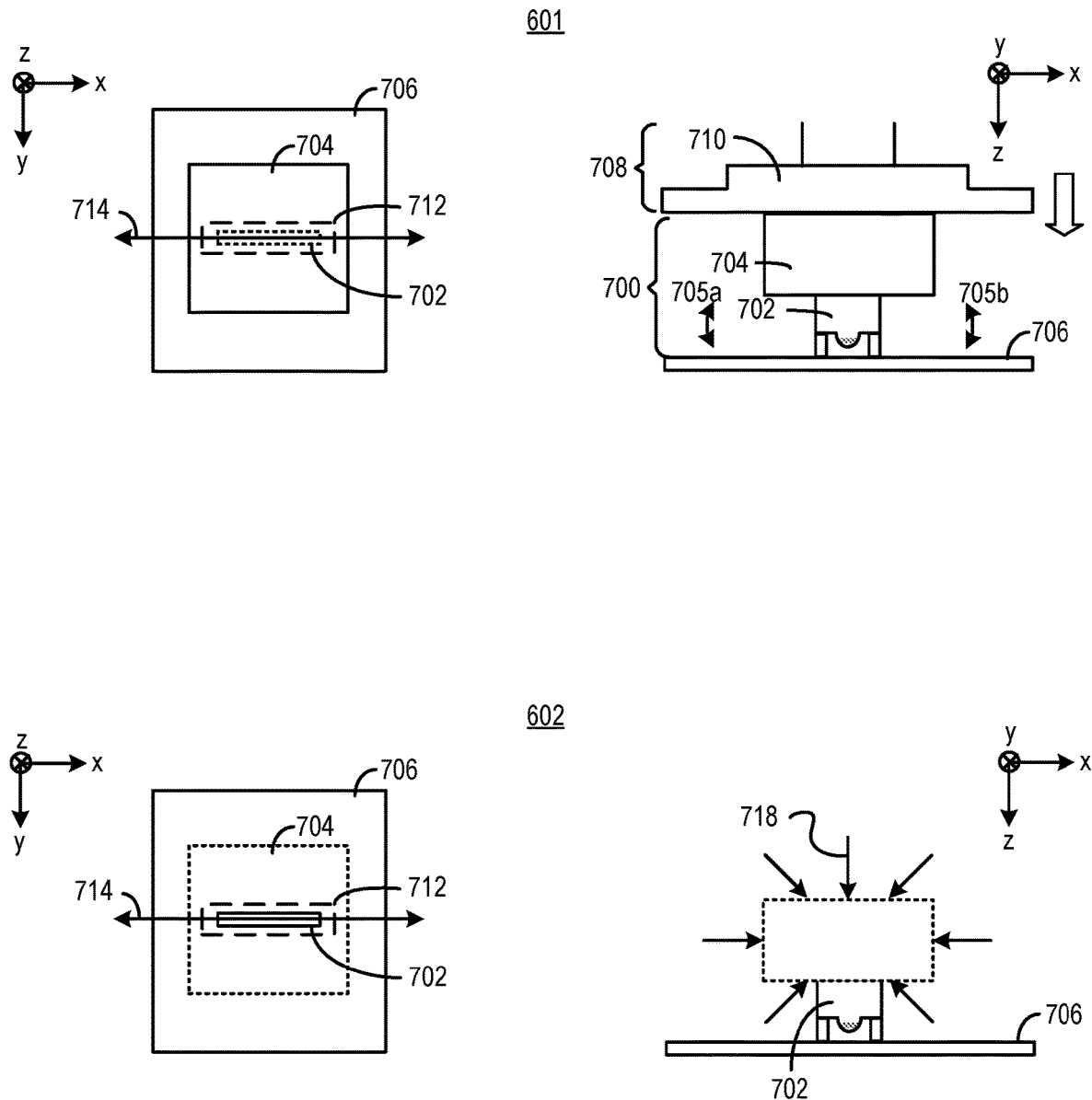
FIG. 7A and FIG. 7B are schematic views illustrating the example process of FIG. 6.
Figure 7B:
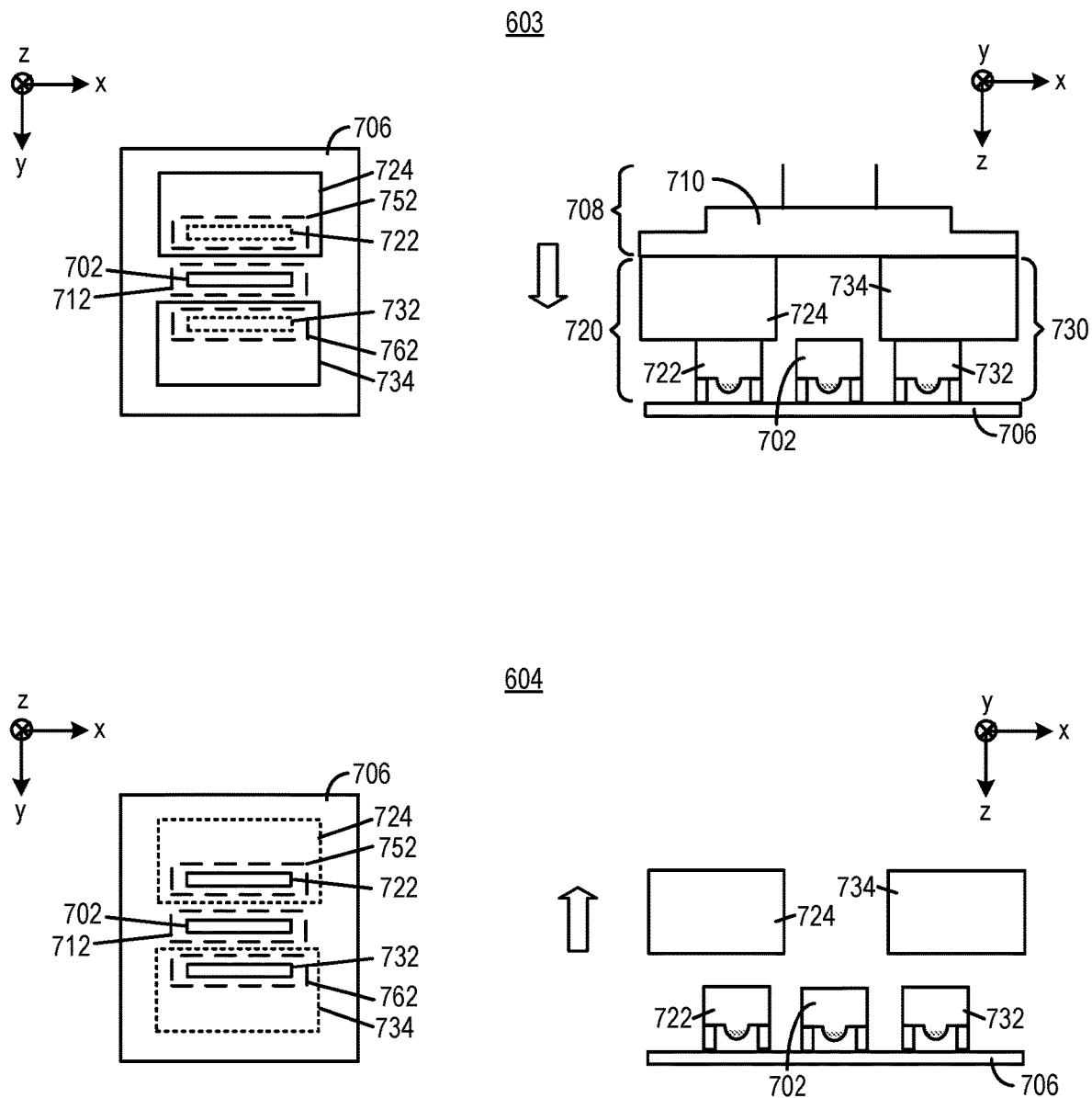

Reference is now made to FIG. 6, FIG. 7A, and FIG. 7B, which illustrate an example of process 600 for assembling strips of LED devices on a backplane to form a display. Process 600 can be used to assemble strips of LED devices (e.g., μLED strips 220, 230, and 240) on a backplane (e.g., backplane 204) using a standard PUT. FIG. 6 is a flowchart that illustrates examples of the steps of process 600, FIG. 7A illustrates the top views of the semiconductor devices involved in process 600, and FIG. 7B illustrates the side views of the semiconductor devices and processing equipment involved in process 600. Although μLED strips are illustrated, it is understood that process 600 can be used to assemble strips of different types of LED devices and is not limited to μLED strips.

Process 600 starts with step 601, in which a PUT is operated to bring a first monolithic semiconductor device comprising a first μLED strip and a first starter substrate towards a backplane, to transfer the first μLED strip to a first set of pre-determined contact locations on the backplane. For example, referring to FIG. 7A, a monolithic semiconductor device 700 comprising a μLED strip 702 and a starter substrate 704 is brought towards a backplane 706 (e.g., a display backplane) using a PUT 708. Starter substrate 704 can include GaAs materials, whereas μLED strip 702 can include a plurality of red μLED dies arranged in a strip. PUT 708 can include a holding device 710 to hold monolithic semiconductor device 700 via starter substrate 704, and to move monolithic semiconductor device 700 towards backplane 706 to bring the device-side bumps of μLED strip 702 into contact with the backplane-side bumps on backplane 706 at location 712. Conductive bonds can then be formed between device-side bumps of μLED strip 702 and the backplane-side bumps on backplane 706.

In step 601, starter substrate 704 can be configured as an intermediary device between μLED strip 702 and PUT 708, to facilitate the handling and transfer operations by PUT 708. For example, starter substrate 704 provides a much larger area to engage with holding device 710 with the PUT (e.g., the suction cup of a vacuum PUT, the stamp of a stamp PUT, etc.) than μLED strip 702, which enables use of a standard PUT (instead of a microscopic PUT) for handling and transfer of μLED strip 702. Moreover, the larger engagement area also facilitates precise control of the orientations and locations of the μLED strip 702 when μLED strip 702 is released onto backplane 706, to ensure that μLED strip 702 is upright (e.g., aligned with z-axis) and is placed at location 712. Moreover, starter substrate 704 also provides structural support for μLED strip 702 to prevent breakage, and to block adhesives (if used for PUT 708) from dripping onto backplane 706. All these can improve the efficiency and yield of the manufacture of the displays.

In addition, as shown in FIG. 7A, μLED strip 702 is formed along a centerline 714 on starter substrate 704. Such arrangements can provide a number of advantages. First, as to be discussed below, such arrangements can facilitate removal of starter substrate 704 using etching. Moreover, such arrangements also facilitate control of the orientation of μLED strip 702 such that μLED strip 702 can remain upright when being placed on backplane 706. For example, holding device 710 may create two rotational forces 705a and 705b around a pivot point formed by μLED strip 702. By having μLED strip 702 at a center between two rotational forces 705a and 705b, the rotational moments created by the rotational forces can be balanced, which can prevent tilting of μLED strip 702. In addition, as to be discussed below, placing red μLED strip 702 along centerline 714 also facilitates placement of μLED strips of other colors (e.g., blue μLED strip and green μLED strip). For example, after placing red μLED strip 702 along centerline 714, a blue μLED strip and a green μLED strip can be placed on two sides of red μLED strip 702 simultaneously (or in the same placement operation). As the blue μLED strip and the green μLED strip are separated by red μLED strip 702, the blue μLED substrate and the green μLED substrate do not impede each other, and there is no need to, for example, remove the blue μLED substrate prior to placing the green μLED or vice versa, and the blue and green μLED substrate can be removed simultaneously (or in the same removal operation, such as laser lift-off). All these can reduce the complexity of the process of forming the display, while improving the yield and the efficiency of the process.

In step 602, the first starter substrate of the first monolithic semiconductor device can be etched away, to allow other μLED strips to be assembled adjacent to location 716 and parallel with μLED strip 702 as to be described below. As part of step 602, PUT 708 can be moved away from monolithic semiconductor device 700, and starter substrate 704 can be etched away using, for example, wet-etching agent 718. After etching of starter substrate 704 completes, μLED strip 702 remains conductively bonded to backplane 706 at location 712, in step 603.

In some examples, the etching of starter substrate 704 can be performed using an anisotropic etching process, in which the etching rate is orientation-dependent. For example, the etching rate can be configured to the highest along the direction parallel with the X and Y axis, to reduce the etching time. Moreover, as µLED strip 702 is formed along centerline 714 of starter substrate 704, symmetric etching of starter substrate 704 can occur on both sides of µLED strip 702, which can simplify the control of the etching process.

In step 603, the PUT (or a different PUT) can be operated to bring a second monolithic semiconductor device comprising a second µLED strip and a second starter substrate towards the backplane, to transfer the second µLED strip to a second set of pre-determined contact locations on one side of the first set of pre-determined contact locations on the backplane. Step 603 may further include operating the PUT to bring a third monolithic semiconductor device comprising a third µLED strip and a third starter substrate towards a backplane, to transfer the third µLED strip to a third set of pre-determined contact locations on another side of the first set of pre-determined contact locations on the backplane. Three parallel µLED strips comprising the first, second, and third µLED strips can be formed on the backplane. The second µLED strip and the third µLED strip can be configured to emit a different color of light than the first µLED strip. For example, the second µLED strip and the third µLED strip can be, respectively, blue and green µLED strips.

In some examples, the PUT can be operated to bring the second monolithic semiconductor device and the third monolithic semiconductor device together towards the backplane to transfer the second µLED strip and the third µLED strip to the backplane simultaneously, to shorten the time required for the transfer. In some examples, the second monolithic semiconductor device and the third monolithic semiconductor device can be brought towards the backplane at different times.

For example, referring to FIG. 7B, PUT 708 can be operated to bring a monolithic semiconductor device 720 and a monolithic semiconductor device 730 towards backplane 706. Monolithic semiconductor device 720 may include a µLED strip 722 and a starter substrate 724, whereas monolithic semiconductor device 730 may include a µLED strip 732 and a starter substrate 734. µLED strip 722 can include a plurality of blue µLED dies arranged in a strip, whereas µLED strip 732 can include a plurality of green µLED dies also arranged in a strip. Both starter substrates 724 and 734 can include sapphire or aluminum oxide ($Al_2O_3$) substrates. Each starter substrate can be configured as an intermediary device between µLED strip 722 and PUT 708, and between µLED strip 732 and PUT 708, to facilitate the handling and transfer operations by PUT 708. For example, PUT 708 can hold both monolithic semiconductor devices 720 and 730 via, respectively, starter substrates 724 and 734, to move both monolithic semiconductor devices 720 and 730 towards backplane 706 simultaneously.

Moreover, PUT 708 can be operated to position monolithic semiconductor device 720 and monolithic semiconductor device 730 to bring the device-side bumps of µLED strip 722 into contact with the backplane-side bumps on backplane 706 at location 752 on one side of location 712 (where red µLED strip 702 is conductively bonded), and to bring the device-side bumps of µLED strip 732 into contact with the backplane-side bumps on backplane 706 at location 762 on another side of location 712. Conductive bonds can then be formed between device-side bumps of µLED strip 722 and the backplane-side bumps on backplane 706 at location 752, and between device-side bumps of µLED strip 732 and the backplane-side bumps on backplane 706 at location 762. With such arrangements, µLED strips 702, 722 and 732 can be assembled as three parallel µLED strips similar to µLED strips 220, 230, and 240 of FIG. 2C.

Moreover, µLED strips 722 and 732 can be formed, respectively, at a pre-determined location on starter substrates 724 and 734 such that the starter substrates do not touch µLED strip 702 when approaching backplane 706. The locations of µLED strips 722 and 732 on, respectively, starter substrates 724 and 734 may be pre-determined based on various factors, such as the separations between the µLED strips on backplane 706 along the x-axis, a width of the starter substrate (measured along the x-axis), etc. In the example shown in FIG. 7B, based on the separations between the µLED strips on backplane 706 and the widths of starter substrates 724 and 734, µLED strip 722 is formed near an edge of starter substrate 724 that faces starter substrate 734, whereas µLED strip 732 is formed near an edge of starter substrate 734 that faces starter substrate 724. In some other examples (not shown in FIG. 7B), µLED strip 722 can be formed along a centerline of starter substrate 724 parallel with the x-axis, and µLED strip 732 can be formed along a centerline of starter substrate 734 parallel with the x-axis, provided that sufficient clearance space exists between the starter substrates and µLED strip 702 when the starter substrates are brought towards backplane 706.

In some examples, step 603 can be followed by an optional step 604, in which starter substrates 724 and 734 can be removed from, respectively, µLED strips 722 and 732. There can be various reasons for removing starter substrates 724 and 734. For example, starter substrates 724 and 734 may cause diffraction which can change the emission direction of the light generated by the respective µLED devices. As another example, starter substrates 724 and 734 may extend over and block off a substantial area adjacent to locations 752 and 762, which can prevent other µLED dies from being transferred onto the blocked area. To remove starter substrates 724 and 734 from µLED strips 722 and 732, a laser lift-off process (LLO) can be performed to project laser light through starter substrates 724 and 734 to weaken the bonding between the starter substrates and the respective µLED strips. Following the LLO process, PUT 708 can be operated to pull starter substrates 724 and 734 away from backplane 706, to separate the starter substrates from the respective µLED strips.

In the example of FIG. 7A and FIG. 7B, the LED strip in the middle of a group of three parallel µLED strips (e.g., red µLED strip 702) is transferred onto backplane 706 first, followed by the other µLED strips of the group (e.g., blue µLED strip 722 and green µLED strip 732). In other examples, the blue (or green) µLED strip can be transferred onto backplane 706 first, followed by red µLED strip 702.

Figure 8:
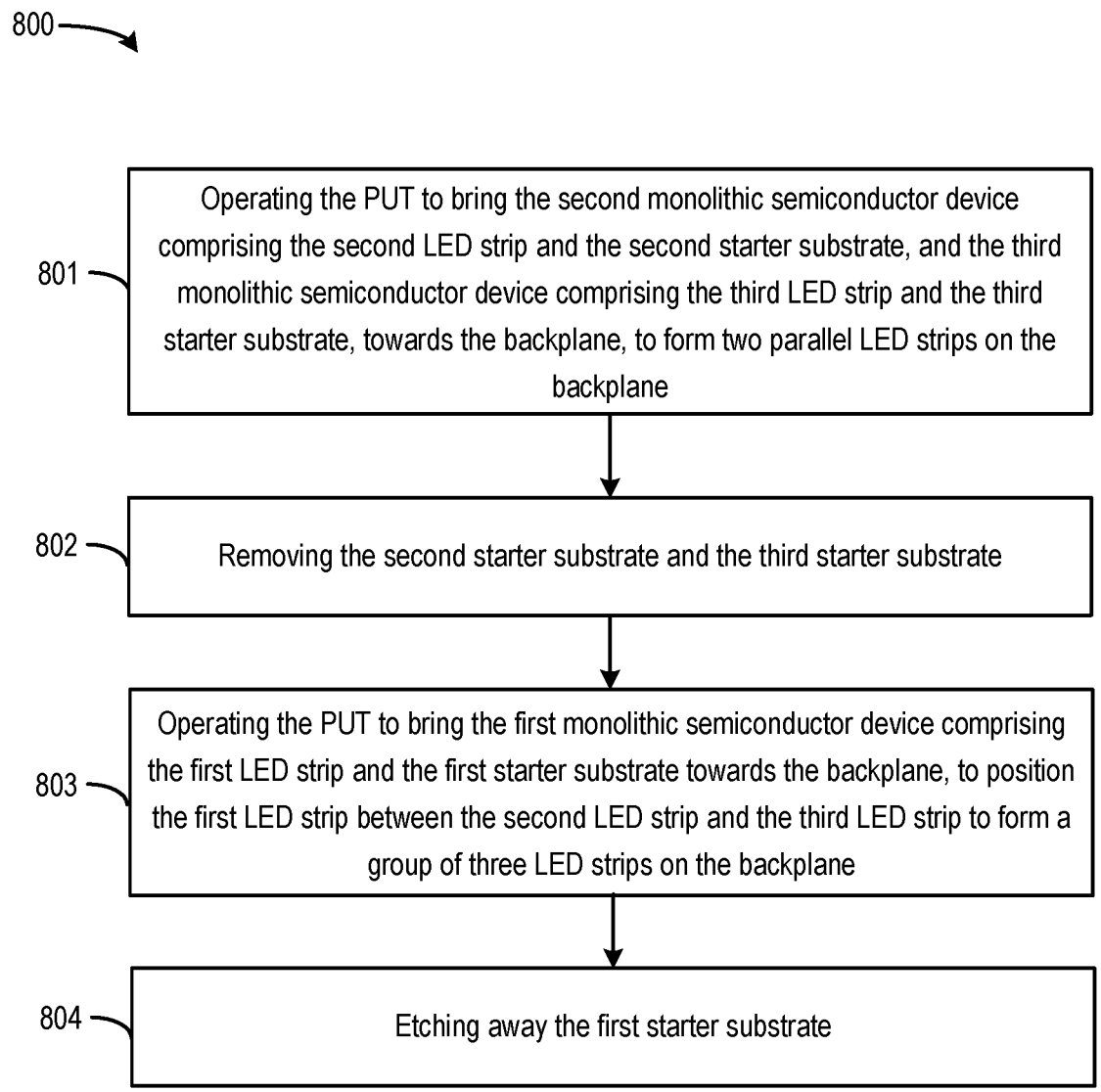
FIG. 8 illustrates an example process of forming multiple strips of LED display elements on a backplane according to examples of the disclosed techniques.
Figure 9A:
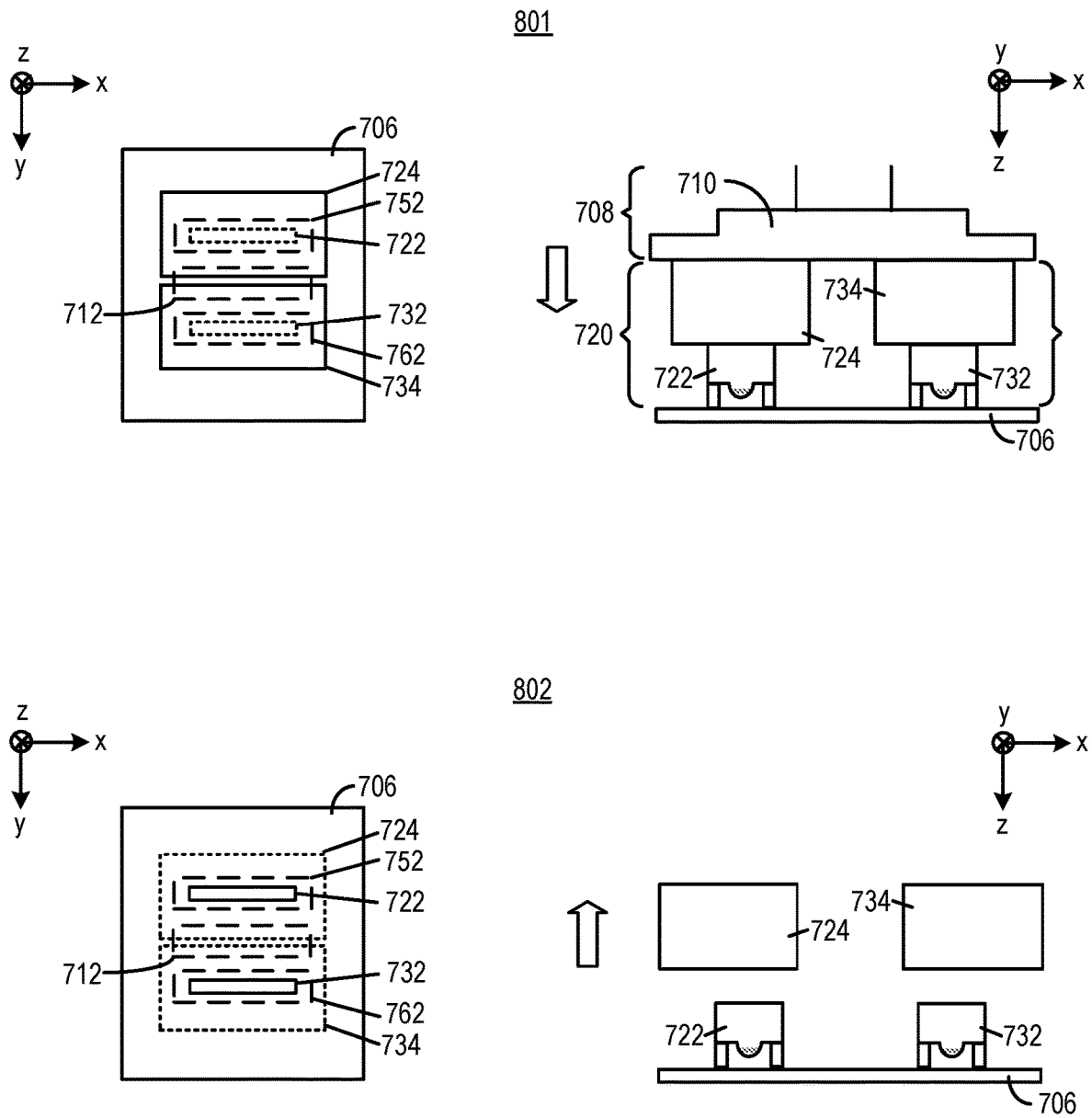
FIG. 9A and FIG. 9B are schematic views illustrating the example process of FIG. 6.
Figure 9B:
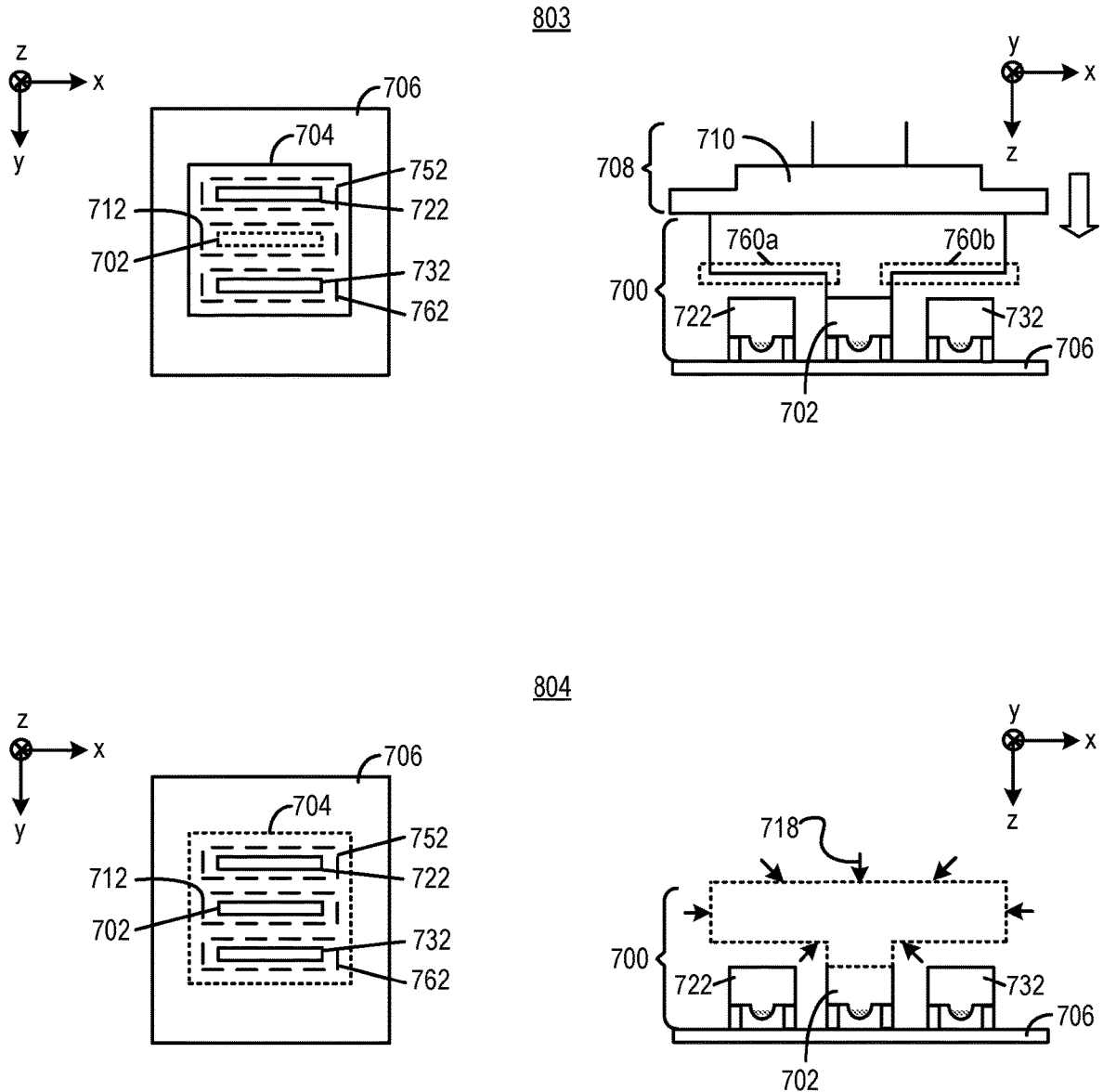

Reference is now made to FIG. 8, FIG. 9A, and FIG. 9B, which illustrate an example of process 800 for assembling strips of LED devices on a backplane to form a display. As to be discussed below, process 800 comprises assembling blue and green µLED strips on the backplane, followed by placing a red µLED strip between the blue and green µLED strips. Process 800 can also be implemented using a standard PUT. FIG. 8 is a flowchart that illustrates examples of the steps of process 800, FIG. 9A illustrates the top views of the semiconductor devices involved in process 800, and FIG. 9B illustrates the side views of the semiconductor devices and processing equipment involved in process 800.

Process 900 starts with step 801, in which a PUT 708 can be operated to bring monolithic semiconductor device 720 and monolithic semiconductor device 730 towards backplane 706. Monolithic semiconductor device 720 includes µLED strip 722 and starter substrate 724, whereas monolithic semiconductor device 730 includes µLED strip 732 and starter substrate 734. µLED strip 722 can include a strip of blue μLED dies, whereas μLED strip 732 can include a strip of green μLED dies. Both starter substrates 724 and 734 can include sapphire or aluminum oxide (Al$_2$O$_3$) substrates. Unlike process 600 in which μLED strips 722 and 732 are formed near the edges of respective starter substrates 724 and 734 to avoid overlapping with location 712 (and to avoid contact with μLED strip 702), in process 900 μLED strips 722 and 732 can be formed at any pre-determined location on respective starter substrates 724 and 734, since μLED strip 702 is not at location 712 when monolithic semiconductor device 720 and monolithic semiconductor device 730 approach backplane 706. For example, as shown in FIG. 9A, μLED strips 722 and 732 can be formed along a centerline of respective starter substrates 724 and 734 along the x-axis. Forming the μLED strips on the centerline of respective starter substrates can facilitate maintaining the upright orientations of the μLED strips when they are brought into contact with backplane 706, as explained above.

In step 802, starter substrates 724 and 734 can be removed from, respectively, μLED strips 722 and 732, to avoid starter substrates 724 and 734 impeding the transfer of μLED strip 702 to location 712 of backplane 706. A laser lift-off process (LLO) can be performed to project laser light through starter substrates 724 and 734 to weaken the bonding between the starter substrates and the respective μLED strips. Following the LLO process, PUT 708 can be operated to pull starter substrates 724 and 734 away from backplane 706, to separate the starter substrates from the respective μLED strips.

Referring to FIG. 9B, in step 803, monolithic semiconductor device 700 comprising μLED strip 702 and starter substrate 704 can be brought towards backplane 706 using a PUT 708, to bring the device-side bumps of μLED strip 702 into contact with the backplane-side bumps on backplane 706 at location 712. Starter substrate 704 can include GaAs materials, whereas μLED strip 702 can include a red μLED as explained above. As shown in FIG. 9B, starter substrate 704 in process 800 can include a step structure 760a and a step structure 760b on two sides of μLED strip 702. The step structures can be formed to create vertical clearance (along the z-axis) over μLED strips 722 and 732, which are conductively bonded with backplanes at respective locations 752 and 762 when starter substrate 704 approaches backplane 706. As shown in FIG. 9B, μLED strip 702 can be formed along a centerline (e.g., centerline 714) of starter substrate 704, to facilitate subsequent etching and control of orientation, as explained above.

In step 804, PUT 708 can be moved away from monolithic semiconductor device 700, and starter substrate 704 can be etched away using, for example, wet-etching agent 718. After etching of starter substrate 704 completes, μLED strip 702 remains conductively bonded to backplane 706 at location 712, and a group of three parallel μLED strips can be assembled on backplane 706.

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some embodiments, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A method, comprising:
    forming a plurality of light emitting diode (LED) dies on a single starter substrate;
    moving, using a pick up tool (PUT), the single starter substrate and the plurality of LED dies on the single starter substrate towards a backplane;
    establishing electrical conductive bonds between the plurality of LED dies and the backplane; and
    releasing the PUT from the single starter substrate to enable transferring of the plurality of LED dies to the backplane.

2. The method of claim 1, wherein the plurality of LED dies forms a first strip having a first width along a first axis and a first length along a second axis;
    wherein the single starter substrate has a second width along the first axis;
    wherein the first width is of several orders of magnitude below the first length; and
    wherein the second width is of several orders of magnitude above the first width.

3. The method of claim 1, wherein the PUT comprises a holding device having a dimension that is of several orders of magnitude above a dimension of each of the plurality of LED dies.

4. The method of claim 3, wherein the PUT comprises at least one of: a vacuum PUT or a stamp PUT.

5. The method of claim 4, further comprising:
adhering a stamp of the stamp PUT to the starter substrate using an adhesive material; and
moving the stamp to bring the starter substrate towards the backplane.

6. The method of claim 5, wherein the stamp of the stamp PUT is adhered to the starter substrate at an adhesion location of the starter substrate, the adhesion location being determined to enable the starter substrate to block the adhesive material from reaching a surface of the backplane to which the plurality of LED dies are conductively bonded.

7. The method of claim 3, further comprising:
operating the PUT to control an orientation of the starter substrate to control orientations of the plurality of LED dies when device-side bumps of the plurality of LED dies are brought into contact with backplane-side bumps of the backplane.

8. The method of claim 1, wherein: the plurality of LED dies forms a first LED strip, and the single starter substrate is a first single starter substrate; and
wherein the method further comprises:
forming a second LED strip on a second single starter substrate;
moving, using the PUT, the second single starter substrate and the second LED strip on the second single starter substrate towards the backplane; and
establishing electrical conductive bonds between the second LED strip and the backplane.

9. The method of claim 8, further comprising:
forming a third LED strip on a third single starter substrate;
moving, using the PUT, the third single starter substrate and the third LED strip on the third single starter substrate towards the backplane; and
establishing conductive bonds between the third LED strip and the backplane.

10. The method of claim 9, wherein:
the first LED strip is assembled as a red LED strip on the backplane,
the second LED strip is assembled as a blue LED strip on the backplane,
the third LED strip is assembled as a green LED strip on the backplane, and
the red LED strip, the blue LED strip, and the green LED strip form a group of three parallel LED strips on the backplane.

11. The method of claim 9, wherein the second single starter substrate and the third single starter substrate are moved together towards the backplane by the PUT to bring the second LED strip and the third LED strip towards the backplane simultaneously.

12. The method of claim 9, wherein the second single starter substrate and the third single starter substrate are moved towards the backplane at different times.

13. The method of claim 8, wherein the first single starter substrate comprises a gallium arsenide material;
wherein the second single starter substrate comprises a sapphire material;
wherein the first LED strip includes LED devices having a light emitting layer to emit red light; and
wherein the second LED strip includes LED dies having a light emitting layer to emit green light or blue light.

14. The method of claim 8, wherein the first single starter substrate is removed by etching after the electrical conductive bonds between the first LED strip and the backplane are established.

15. The method of claim 8, further comprising:
removing the second single starter substrate from the second LED strip after the electrical conductive bonds between the second LED strip and the backplane are established.

16. The method of claim 15, wherein removing the second single starter substrate from the second LED strip comprises:
projecting laser light via the single second starter substrate to weaken bonding between the second single starter substrate and the second LED strip; and
moving the second single starter substrate away from the second LED strip to break the weakened bonding.

17. The method of claim 8, wherein the second LED strip is brought towards the backplane after the electrical conductive bonds are established between the first LED strip and the backplane.

18. The method of claim 17, wherein the second LED strip is formed closer to a longitudinal edge of the second single starter substrate than to a longitudinal center line of the second single starter substrate.

19. The method of claim 8, wherein the first LED strip is brought towards the backplane after the electrical conductive bonds are established between the second LED strip and the backplane.

20. The method of claim 19, wherein the second LED strip is formed along a longitudinal center line of the second starter substrate.

21. The method of claim 8, wherein the first single starter substrate is removed from the first LED strip prior to establishing electrical conductive bonds between the second LED strip and the backplane.

22. The method of claim 1, wherein each of the plurality of LED dies including a device-side bump;
wherein the backplane includes a plurality of backplane-side bumps at a plurality of contact locations corresponding to the plurality of LED dies; and
wherein the electrical conductive bonds are formed between the device-side bumps of the plurality of LED dies and the backplane-side bumps of the backplane at the plurality of contact locations.

23. The method of claim 1, wherein the PUT is operated to release the single starter substrate after the electrical conductive bonds between the plurality of LED dies and the backplane are established.

* * * * *